United States Patent
Horstman et al.

(10) Patent No.: US 9,045,668 B2
(45) Date of Patent: Jun. 2, 2015

(54) ORGANOSILOXANE BLOCK COPOLYMER

(75) Inventors: John Horstman, Midland, MI (US); Ann Norris, Blacksburg, VA (US); Steven Swier, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 150 days.

(21) Appl. No.: 13/822,088

(22) PCT Filed: Sep. 21, 2011

(86) PCT No.: PCT/US2011/052615
§ 371 (c)(1),
(2), (4) Date: Mar. 11, 2013

(87) PCT Pub. No.: WO2012/040367
PCT Pub. Date: Mar. 29, 2012

(65) Prior Publication Data
US 2013/0168727 A1 Jul. 4, 2013

Related U.S. Application Data

(60) Provisional application No. 61/385,446, filed on Sep. 22, 2010.

(51) Int. Cl.
C09D 183/10 (2006.01)
H01L 33/52 (2010.01)
(Continued)

(52) U.S. Cl.
CPC ........... *C09D 183/10* (2013.01); *C08G 77/04* (2013.01); *C08G 77/14* (2013.01); *C08G 77/26* (2013.01);
(Continued)

(58) Field of Classification Search
None
See application file for complete search history.

(56) References Cited

U.S. PATENT DOCUMENTS 3,294,718 A 12/1966 Antonen
3,294,737 A 12/1966 Krantz
(Continued)

FOREIGN PATENT DOCUMENTS

CN 101484503 A 7/2009
CN 101792529 A 8/2010
(Continued)

OTHER PUBLICATIONS

"10. Block Copolymers", [online]. Retrieved from the Internet: <URL: www.polymer.ph.tum.de/fileadmin/w00bhn/www/PDF/Vorlesungen/2013_SS/Polymerphysik2/chapter10_01.pdf>, (2013), 16 pgs.

(Continued)

*Primary Examiner* — Robert S Loewe
(74) *Attorney, Agent, or Firm* — Schwegman Lundberg & Woessner, P.A.

(57) ABSTRACT

An organosiloxane block copolymer includes 65 to 90 mol % of diorganosiloxane units having the formula $R^1{}_2\text{-SiO}_{2/2}$ (I). These diorganosiloxane units are arranged in linear blocks which have an average of from 10 to 400 diorganosiloxane units per linear block. The organosiloxane block copolymer also includes 10 to 35 mol % of siloxane units that have the average formula $R^2{}_x(OR^3)_y\text{SiO}_{(4-x-y)/2}$ (II). The siloxane units are arranged in nonlinear blocks having at least 2 siloxane units per nonlinear block wherein $0.5 \leq x \leq 1.5$ and $0 \leq y \leq 1$. In addition, each $R^1$ is independently a $C_1$ to $C_{10}$ hydrocarbyl, each $R^2$ is independently an aryl or $C_4$ to $C_{10}$ hydrocarbyl, at least 50 mol % of $R^2$ are aryl, and each $R^3$ is independently $R^1$ or H. Moreover, the organosiloxane block copolymer has a light transmittance of at least 95%.

30 Claims, 9 Drawing Sheets

(51) Int. Cl.

| | | |
|---|---|---|
| C08G 77/14 | (2006.01) | |
| C08G 77/26 | (2006.01) | |
| C08G 77/48 | (2006.01) | |
| C08G 77/54 | (2006.01) | |
| H01L 33/56 | (2010.01) | |
| H01L 27/14 | (2006.01) | |
| H01L 31/0203 | (2014.01) | |
| H01L 31/048 | (2014.01) | |
| C08G 77/04 | (2006.01) | |
| C08G 77/00 | (2006.01) | |

(52) U.S. Cl.
CPC ............... *C08G 77/48* (2013.01); *C08G 77/54* (2013.01); *C08G 77/70* (2013.01); *C08G 77/80* (2013.01); *H01L 33/56* (2013.01); *H01L 27/14* (2013.01); *H01L 31/0203* (2013.01); *H01L 33/52* (2013.01); *H01L 31/0481* (2013.01); *Y02E 10/50* (2013.01)

(56) References Cited

U.S. PATENT DOCUMENTS

| | | | |
|---|---|---|---|
| 3,308,203 | A | 3/1967 | Metevia et al. |
| 3,328,481 | A * | 6/1967 | Vincent .................... 525/477 |
| 3,436,439 | A | 4/1969 | Woods et al. |
| 3,440,262 | A | 4/1969 | Culpepper |
| 3,576,905 | A * | 4/1971 | McKellar et al. ............... 528/34 |
| 3,619,229 | A * | 11/1971 | Hartlein .................... 523/209 |
| 3,629,228 | A * | 12/1971 | Hartlein et al. .............. 528/17 |
| 3,632,793 | A | 1/1972 | Antonen |
| 3,636,134 | A | 1/1972 | Antonen |
| 3,639,155 | A | 2/1972 | Hartlein et al. |
| 3,647,846 | A * | 3/1972 | Hartlein et al. ............... 556/436 |
| 3,670,649 | A * | 6/1972 | Hartlein et al. ............... 102/431 |
| 4,013,611 | A * | 3/1977 | Hechtl et al. ................. 523/212 |
| 4,340,709 | A | 7/1982 | Jeram et al. |
| 4,356,293 | A | 10/1982 | Beubzer et al. |
| 4,419,402 | A * | 12/1983 | Gutek ........................ 442/145 |
| 4,443,502 | A * | 4/1984 | Gutek ........................ 427/387 |
| 4,508,887 | A | 4/1985 | Kohl |
| 4,585,670 | A | 4/1986 | Liu |
| 5,075,103 | A | 12/1991 | Halloran et al. |
| 5,145,933 | A | 9/1992 | Grisoni et al. |
| 5,830,950 | A | 11/1998 | Katsoulis et al. |
| 5,981,670 | A | 11/1999 | Itoh et al. |
| 6,020,409 | A | 2/2000 | Alvarez et al. |
| 6,803,409 | B2 | 10/2004 | Keryk et al. |
| 7,312,008 | B2 * | 12/2007 | Wu et al. .................... 430/66 |
| 7,705,093 | B2 * | 4/2010 | Kashiwagi et al. ........... 525/474 |
| 8,222,352 | B2 | 7/2012 | Hirano |
| 8,921,493 | B2 | 12/2014 | Horstman et al. |
| 8,921,494 | B2 | 12/2014 | Horstman et al. |
| 8,921,495 | B2 | 12/2014 | Horstman et al. |
| 2005/0180712 | A1 * | 8/2005 | Shelnut et al. ................ 385/129 |
| 2006/0035092 | A1 * | 2/2006 | Shimizu et al. ............... 428/447 |
| 2007/0196309 | A1 * | 8/2007 | Tarletsky et al. .......... 424/70.12 |
| 2008/0042142 | A1 | 2/2008 | Sugawara et al. |
| 2009/0297461 | A1 * | 12/2009 | Perle et al. .................... 424/59 |
| 2009/0318725 | A1 | 12/2009 | Takeuchi |
| 2010/0081748 | A1 * | 4/2010 | Taguchi et al. ............... 524/433 |
| 2010/0273927 | A1 * | 10/2010 | Taguchi et al. ............... 524/433 |
| 2013/0165602 | A1 | 6/2013 | Horstman et al. |
| 2013/0171354 | A1 | 7/2013 | Horstman et al. |
| 2013/0172496 | A1 | 7/2013 | Horstman et al. |
| 2013/0245187 | A1 | 9/2013 | Swier et al. |

FOREIGN PATENT DOCUMENTS

| | | |
|---|---|---|
| EP | 2619248 B1 | 8/2014 |
| JP | 48-11211 B1 | 4/1973 |
| JP | 48-042720 B1 | 12/1973 |
| JP | 49-027120 B1 | 7/1974 |
| JP | 49-44937 B1 | 11/1974 |
| JP | 50-36256 B1 | 11/1975 |
| JP | 52-008360 B1 | 3/1977 |
| JP | 53-013680 B1 | 5/1978 |
| JP | 54-83957 A | 7/1979 |
| JP | 56-000827 A | 1/1981 |
| JP | 56-110730 A | 9/1981 |
| JP | 60-053539 A | 3/1985 |
| JP | 08-012761 A | 1/1996 |
| JP | 10-237174 A | 9/1998 |
| JP | 11-021353 A | 1/1999 |
| JP | 2005-527689 A | 9/2005 |
| JP | 2006-022207 A | 1/2006 |
| JP | 2006-206721 A | 8/2006 |
| JP | 2010-100667 A | 5/2010 |
| JP | 2010-116462 A | 5/2010 |
| JP | 2011-190413 A | 9/2011 |
| WO | WO-97/07164 A1 | 2/1997 |
| WO | WO-2009/114190 A2 | 9/2009 |
| WO | WO-2010/051355 A2 | 5/2010 |
| WO | WO-2012/040302 A1 | 3/2012 |
| WO | WO-2012/040305 A1 | 3/2012 |
| WO | WO-2012/040453 A1 | 3/2012 |
| WO | WO-2012/040457 A1 | 3/2012 |

OTHER PUBLICATIONS

"U.S. Appl. No. 13/822,099, Non Final Office Action mailed Apr. 2, 2014", 7 pgs.
"U.S. Appl. No. 13/822,113, Non Final Office Action mailed May 13, 2014", 6 pgs.
"U.S. Appl. No. 13/822,122, Non Final Office Action mailed Apr. 14, 2014", 4 pgs.
"U.S. Appl. No. 13/822,140, Non Final Office Action mailed Apr. 28, 2014", 4 pgs.
"Chinese Application Serial No. 201180053363.6, Office Action mailed Apr. 10, 2014", (w/ English Translation), 12 pgs.
"Chinese Application Serial No. 201180053366.X, Office Action mailed Apr. 10, 2014", (w/ English Translation), 13 pgs.
"Chinese Application Serial No. 201180053369.3, Office Action mailed Mar. 31, 2014", (w/ English Translation), 13 pgs.
"Chinese Application Serial No. 201180053369.3, Voluntary Amendment filed Oct. 24, 2013", (w/ English Translation of Claims), 55 pgs.
"Chinese Application Serial No. 201180053371.0, Voluntary Amendment filed Oct. 28, 2013", (w/ English Translation of Claims), 41 pgs.
"European Application No. 11767349.1, Office Action and Intention to Grant dated Jan. 30, 2014", 7 pgs.
"European Application No. 11767349.1, Office Action mailed May 2, 2013", 2 pgs.
"European Application No. 11767349.1, Response filed Nov. 12, 2013 to Office Action mailed May 2, 2013", (Nov. 12, 2013), 9 pgs.
"European Application Serial No. 11761301.7, Office Action mailed Jan. 15, 2014", 6 pgs.
"European Application Serial No. 11761801.7, Office Action mailed May 15, 2014", 4 pgs.
"European Application Serial No. 11761801.7, Response filed Apr. 17, 2014 to Office Action mailed Jan. 15, 2014", 9 pgs.
"European Application Serial No. 11761802.5, Office Action mailed May 2, 2013", 2 pgs.
"European Application Serial No. 11761802.5, Response filed Nov. 11, 2013 to Office Action mailed May 2, 2013", 17 pgs.
"European Application Serial No. 11761808.2, Office Action mailed Jan. 15, 2014", 5 pgs.
"European Application Serial No. 11761808.2, Response filed May 14, 2014 to Office Action mailed Jan. 15, 2014", 55 pgs.
"European Application Serial No. 11767348.3, Office Action mailed May 2, 2013", 2 pgs.
"European Application Serial No. 11767348.3, Response filed Nov. 11, 2013 to Office Action mailed May 2, 2013", 12 pgs.
"European Application Serial No. 11767349.1, Office Action mailed May 2, 2013", 2 pgs.
"European Application Serial No. 11767349.1, Response filed Nov. 12, 2013 to Office Action mailed May 2, 2013", 13 pgs.

(56) References Cited

OTHER PUBLICATIONS

"International Application Serial No. PCT/US2011/052513, International Preliminary Report on Patentability mailed Apr. 4, 2013", 8 pgs.

"International Application Serial No. PCT/US2011/052513, Written Opinion mailed Nov. 24, 2011", 7 pgs.

"International Application Serial No. PCT/US2011/052518, International Preliminary Report on Patentability mailed Apr. 4, 2013", 7 pgs.

"International Application Serial No. PCT/US2011/052518, Written Opinion mailed Nov. 24, 2011", 5 pgs.

"International Application Serial No. PCT/US2011/052615, International Preliminary Report on Patentability mailed Apr. 4, 2013", 10 pgs.

"International Application Serial No. PCT/US2011/052615, Written Opinion mailed Dec. 2, 2011", 8 pgs.

"International Application Serial No. PCT/US2011/052747, International Preliminary Report on Patentability mailed Apr. 4, 2013", 7 pgs.

"International Application Serial No. PCT/US2011/052751, International Preliminary Report on Patentability mailed Apr. 4, 2013", 7 pgs.

"International Application Serial No. PCT/US2011/052751, Written Opinion mailed Nov. 24, 2011", 5 pgs.

"Japanese Application Serial No. 2013-529430, Office Action mailed Apr. 22, 2014", (w/ English Translation), 11 pgs.

"Japanese Application Serial No. 2013-529434, Office Action mailed Mar. 11, 2014", w/ English Translation), 6 pgs.

"Japanese Application Serial No. 2013-529444, Office Action mailed Apr. 22, 2014", (w/ English Translation), 8 pgs.

"Japanese Application Serial No. 2013-529445, Office Action mailed Mar. 11, 2014", (w/ English Translation), 4 pgs.

"Japanese Application Serial No. 2013529429, Office Action mailed Mar. 4, 2014", (w/ English Translation), 7 pgs.

"Korean Application Serial No. 10-2013-7010239, Amendment filed Apr. 2, 2014", 11 pgs.

"Korean Application Serial No. 10-2013-7010239, Notice of Preliminary Rejection mailed May 30, 2014", 5 pgs.

"Korean Application Serial No. 10-2013-7010245, Amendment filed Mar. 19, 2014", 6 pgs.

"Korean Application Serial No. 10-2013-7010245, Notice of Preliminary Rejection mailed May 30, 2014", 3 pgs.

"Machine Translation of JP 48-42720, published Dec. 14, 1973", 8 pgs.

"Machine Translation of JP 08-012761A published Jan. 16, 1996", 10 pgs.

Bahadur, Pratap, "Block copolymers—Their microdomain formation (in solid state) and surfactant behaviour (in solution)", *Current Science*, 80(8), (2001), 1002-1007.

Quirk, Roderic P., et al., "Chapter 12—Polyester Thermoplastic Elastomers: Part I", In: *Handbook of Elastomers, Second Edition, Revised and Expanded*, Bhowmick, A. K., et al., Editors, Marcel Dekker, Inc., New York, NY, (2001), 353-365.

"International Application No. PCT/US2011/052513, International Search Report mailed Nov. 24, 2011", 3 pgs.

"International Application No. PCT/US2011/052518, International Search Report mailed Nov. 24, 2011", 3 pgs.

"International Application No. PCT/US2011/052615, International Search Report mailed Dec. 2, 2011", 4 pgs.

"International Application No. PCT/US2011/052747, International Search Report mailed Nov. 24, 2011", 3 pgs.

"International Application No. PCT/US2011/052751, International Search Report mailed Nov. 24, 2011", 4 pgs.

"Silicones", Encyclopedia of Polymer Science and Technology, Wiley, US (XP007918236), Apr. 15, 2003, 765-841.

Su, Kai, et al., "Siloxane Materials for Optical Applications", Proceedings of the SPIE, The International Society for Optical Engineering SPIE, USA, vol. 6029 (XP002429343), Jan. 20, 2006, 1-8.

"U.S. Appl. No. 13/822,099, Notice of Allowance mailed Aug. 22, 2014", 6 pgs.

"U.S. Appl. No. 13/822,099, Response filed Aug. 4, 2014 to Non Final Office Action mailed Apr. 2, 2014", 16 pgs.

"U.S. Appl. No. 13/822,113, Notice of Allowance mailed Oct. 9, 2014", 7 pgs.

"U.S. Appl. No. 13/822,113, Response filed Sep. 12, 2014 to Non Final Office Action mailed May 13, 2014", 15 pgs.

"U.S. Appl. No. 13/822,122, Notice of Allowance mailed Aug. 20, 2014", 6 pgs.

"U.S. Appl. No. 13/822,122, Response filed Jul. 14, 2014 to Non Final Office Action mailed Apr. 14, 2014", 9 pgs.

"U.S. Appl. No. 13/822,140, Notice of Allowance mailed Aug. 22, 2014", 6 pgs.

"U.S. Appl. No. 13/822,140, Response filed Jul. 28, 2014 to Non Final Office Action mailed Apr. 28, 2014", 5 pgs.

"Chinese Application Serial No. 201180053368.9, Office Action mailed May 28, 2014", (w/ English Translation), 8 pgs.

"Chinese Application Serial No. 201180053369.3, Response filed Aug. 15, 2014 to Office Action mailed Mar. 31, 2014", (w/ English Translation of Amended Claims), 18 pgs.

"Chinese Application Serial No. 201180053371.0, Office Action mailed Jun. 9, 2014", (w/ English Translation), 11 pgs.

"European Application Serial No. 11761801.7, Response filed Sep. 11, 2014 to Office Action mailed May 15, 2014", 8 pgs.

"Japanese Application Serial No. 2013-529434, Response filed Jul. 7, 2014 to Office Action mailed Mar. 11, 2014", (w/ English Translation of Amended Claims), 15 pgs.

"Japanese Application Serial No. 2013-529444, Response filed Jul. 22, 2014 to Office Action mailed Apr. 22, 2014", (w/ English Translation of Claims), 8 pgs.

"Japanese Application Serial No. 2013-529445, Response filed Jun. 11, 2014 to Office Action mailed Mar. 11, 2014", 9 pgs.

"Japanese Application Serial No. 2013-529429, Office Action mailed Jul. 29, 2014", 2 pgs.

"Japanese Application Serial No. 2013-529429, Response Jul. 3, 2014 to Office Action mailed Mar. 4, 2014", (w/ English Translation of Amended Claims), 9 pgs.

\* cited by examiner

ORGANOSILOXANE BLOCK COPOLYMER

FIELD OF THE INVENTION

The present invention generally relates to an organosiloxane block copolymer including a particular mole percent of linear diorganosiloxane units and a particular mole percentage of non-linear siloxane units. More specifically, the organosiloxane block copolymer has a light transmittance of at least 95%.

DESCRIPTION OF THE RELATED ART

Optoelectronic semiconductors, and electronic articles that include such semiconductors, are well known in the art. Common optoelectronic semiconductors include photovoltaic (solar) cells and diodes. Photovoltaic cells convert light of many different wavelengths into electricity. Conversely, diodes, such as light emitting diodes (LEDs), generate light of many different wavelengths from electricity.

LEDs generally include one or more diodes that emit light when activated and typically utilize either flip chips or wire bonded chips that are connected to the diodes to provide power. As described in greater detail below, many LEDs are encapsulated using similar components and methods as those used to encapsulate photovoltaic cells, thereby increasing production costs and complexities.

There are two general types of photovoltaic cells, wafers and thin films. Wafers are thin sheets of semiconductor material that are typically formed from mechanically sawing the wafer from a single crystal or multicrystal ingot. Alternatively, wafers can be formed from casting. Thin film photovoltaic cells usually include continuous layers of semi-conducting materials deposited on a substrate using sputtering or chemical vapor deposition processing techniques.

Typically, the photovoltaic cells are included in photovoltaic cell modules (modules) that also include tie layers, substrates, superstrates, and/or additional materials that provide strength and stability. In many applications, the photovoltaic cells are encapsulated to provide additional protection from environmental factors such as wind and rain. To date, however, encapsulants and encapsulation methods known in the art have been expensive and time consuming and, in many cases, ineffective.

Some modules include glass substrates bonded to glass superstrates to encapsulate the photovoltaic cells. These types of modules are very heavy and cumbersome, are prone to breakage, scratching, and etching, and are usually made using processes that are slow and inefficient. This results in increased cost for the end purchaser.

Other modules include ethyl vinyl acetate (EVA) to encapsulate the photovoltaic cells. EVA is used because it is able to harvest light for the photovoltaic cells. However, EVA is degraded by wavelengths of light below 400 nm. Hence, current photovoltaic cells including EVA are limited to harvesting light at wavelengths above 400 nm. More specifically, EVA has low UV resistance, has a tendency to discolor, and has a tendency to chemically and physically degrade upon exposure to light.

EVA is also known to exhibit poor adhesive properties relative to glass substrates and have a high modulus. These poor adhesive properties and high modulus tend to cause increased stress conditions around the photovoltaic cells which result in gradual delamination of the encapsulant from the substrate. This delamination results in several negative effects on cell efficiency including water accumulation in the encapsulant ultimately resulting in photovoltaic cell corrosion.

To solve these problems, the industry has used increased amounts of EVA in the photovoltaic cells to reduce delamination and discoloring. However, this reduces a total amount of available light impinging on the photovoltaic cell, thereby reducing cell efficiency. Additionally, glass doped with cerium and antimony has been used as a substrate or superstrate of the photovoltaic cells to protect the EVA from UV damage. Further, UV stabilizing packages including UV absorbers and/or hindered amine light stabilizers have been added to the EVA. Use of the doped glass or UV absorbers typically causes a 1% to 5% loss in photovoltaic cell efficiency.

Typically, EVA is applied as one or more thermosetting sheets that are sandwiched between a substrate and a superstrate and subjected to heat, vacuum and pressure. These conditions cause the EVA to flow, wet the substrate and the superstrate, and encapsulate the photovoltaic cell. Production of photovoltaic cells in this way is relatively expensive and time consuming.

Alternatively, the EVA may be cured through use of peroxides to initiate a radical cure. This method, however, tends to promote side reactions that reduce overall durability. If peroxides are used, curing temperatures typically range from 150° C. to 160° C. These temperatures may cause excessive stress in the photovoltaic cells and result in mechanical breakdown and/or increased production time and number of steps needed to strengthen the photovoltaic cells. Accordingly, there remains an opportunity to improve on the prior art.

SUMMARY OF THE INVENTION AND ADVANTAGES

The instant invention provides an organosiloxane block copolymer including 65 to 90 mol % of diorganosiloxane units having the formula $R^1{}_2SiO_{2/2}$ (I). These diorganosiloxane units are arranged in linear blocks having an average of from 10 to 400 diorganosiloxane units per linear block. The organosiloxane block copolymer also includes 10 to 35 mol % of siloxane units having the average formula $R^2{}_x(OR^3)_ySiO_{(4-x-y)/2}$ (II). The siloxane units are arranged in nonlinear blocks having at least 2 siloxane units per nonlinear block wherein $0.5 \leq x \leq 1.5$ and $0 \leq y \leq 1$. In addition, each $R^1$ is independently a $C_1$ to $C_{10}$ hydrocarbyl, each $R^2$ is independently an aryl or $C_4$ to $C_{10}$ hydrocarbyl, at least 50 mol % of $R^2$ are aryl, and each $R^3$ is independently $R^1$ or H. Moreover, the organosiloxane block copolymer has a light transmittance of at least 95%. This invention also provides various embodiments of methods used to form the organosiloxane block copolymer and electronic articles that include the organosiloxane block copolymer.

The combination of the linear diorganosiloxane units of Formula (I) and the non-linear siloxane units of Formula (II) allow the organosiloxane block copolymer to have a high light transmittance and to be used in many applications. These linear and non-linear units also tend to allow the organosiloxane block copolymer to flow and cure upon heating yet remain stable at room temperature and also to be able to be processed using lamination techniques. Moreover, these linear and non-linear units contribute to the physical properties of the organosiloxane block copolymer and allow electronic articles to be formed that are resistant to weather, that can be formed in low cost and low complexity procedures, and that are energy efficient.

BRIEF DESCRIPTION OF THE SEVERAL VIEWS OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1A:
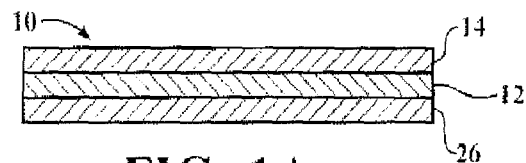
FIG. 1A is a side view of one embodiment of the electronic article of the instant invention including an encapsulant disposed on an optoelectronic semiconductor and a substrate.
Figure 1B:
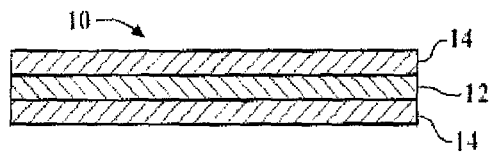
FIG. 1B is a side view of another embodiment of the electronic article including two layers of the encapsulant and the optoelectronic semiconductor.
Figure 1C:
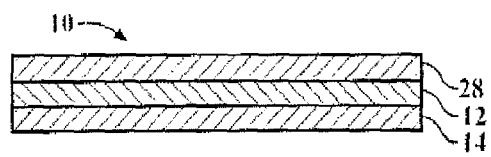
FIG. 1C is a side view of yet another embodiment of the electronic article including a superstrate, the encapsulant, and the optoelectronic semiconductor.
Figure 1D:
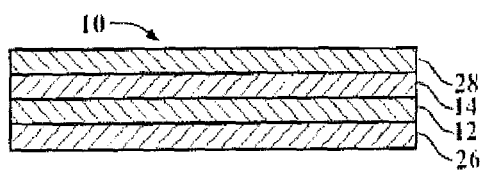
FIG. 1D is a side view of the electronic article of FIG. 1A further including a superstrate.
Figure 1E:
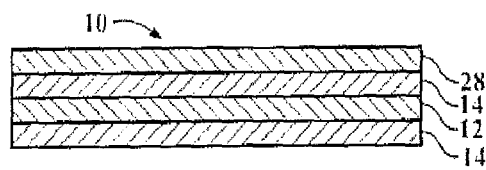
FIG. 1E is a side view of the electronic article of FIG. 1B further including a superstrate.
Figure 1F:
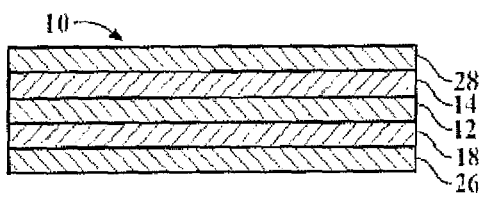
FIG. 1F is a side view of another embodiment of the electronic article including a superstrate, the encapsulant, the optoelectronic semiconductor, a tie layer, and the substrate.
Figure 1G:
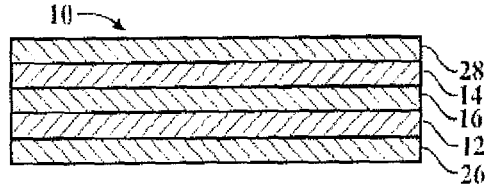
FIG. 1G is a side view of another embodiment of the electronic article including the superstrate, the encapsulant, an antireflective coating, the optoelectronic semiconductor, and a substrate.
Figure 2A:
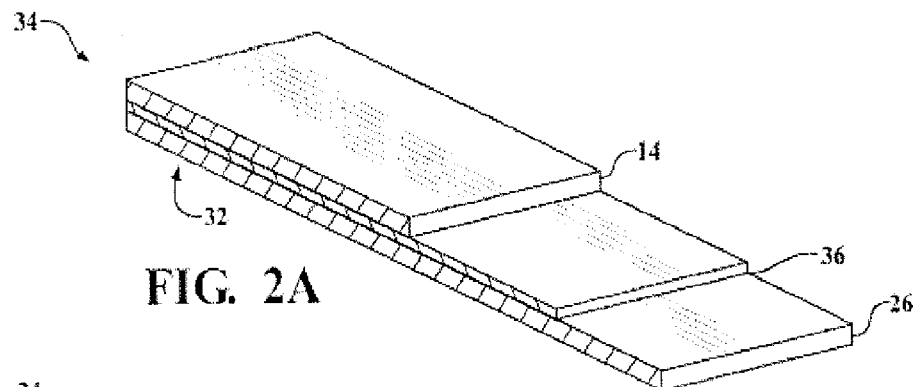
FIG. 2A is a cross-sectional view of one embodiment of a photovoltaic cell module relating to FIG. 1A.
Figure 2B:
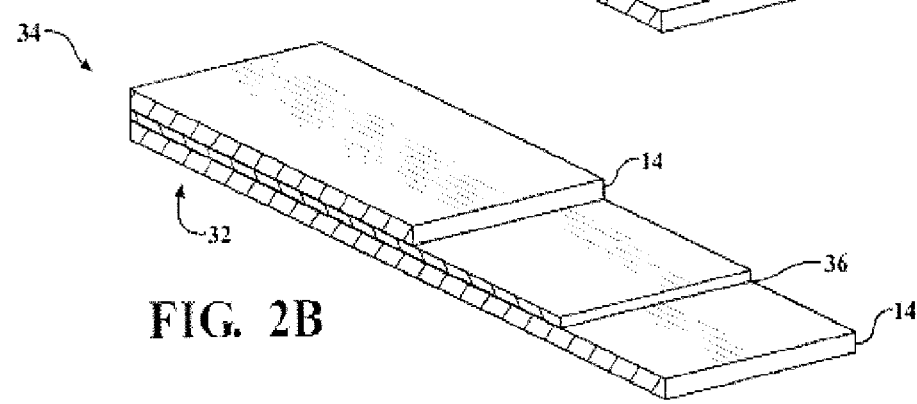
FIG. 2B is a cross-sectional view of one embodiment of a photovoltaic cell module relating to FIG. 1B
Figure 2C:
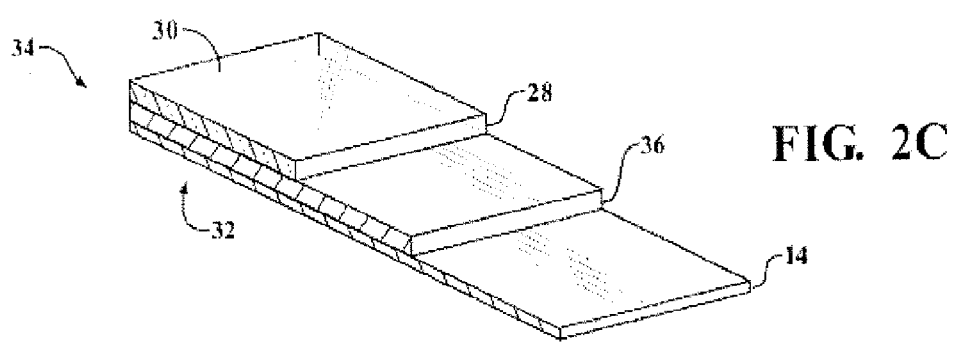
FIG. 2C is a cross-sectional view of one embodiment of a photovoltaic cell module relating to FIG. 1C.
Figure 2D:
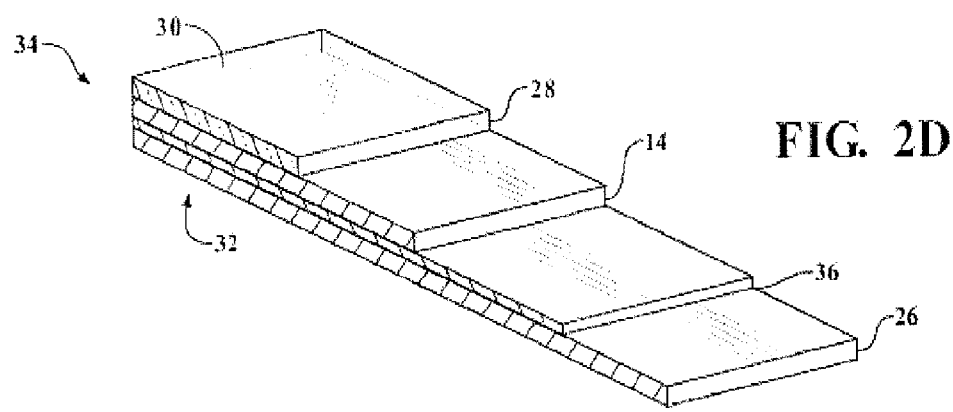
FIG. 2D is a cross-sectional view of one embodiment of a photovoltaic cell module relating to FIG. 1C.
Figure 2E:
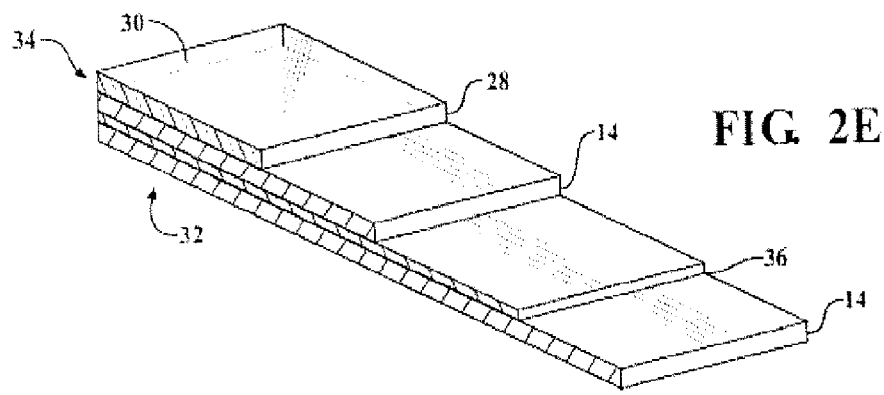
FIG. 2E is a cross-sectional view of one embodiment of a photovoltaic cell module relating to FIG. 1E.
Figure 2F:
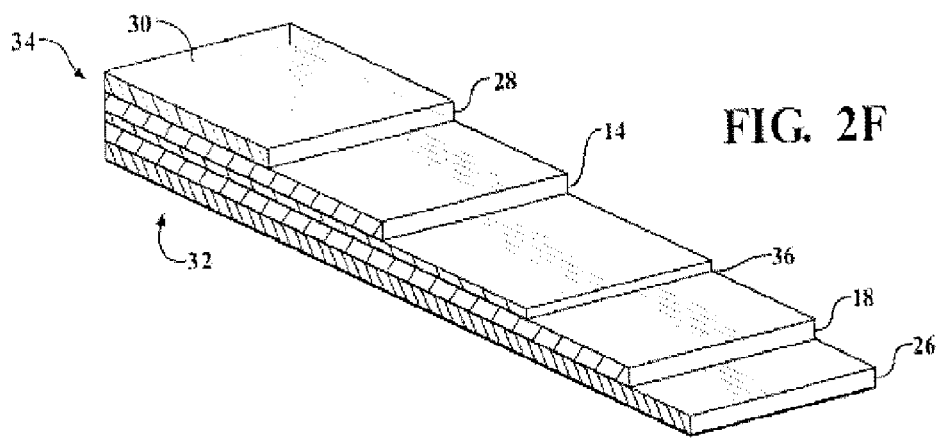
FIG. 2F is a cross-sectional view of one embodiment of a photovoltaic cell module relating to FIG. 1F.
Figure 2G:
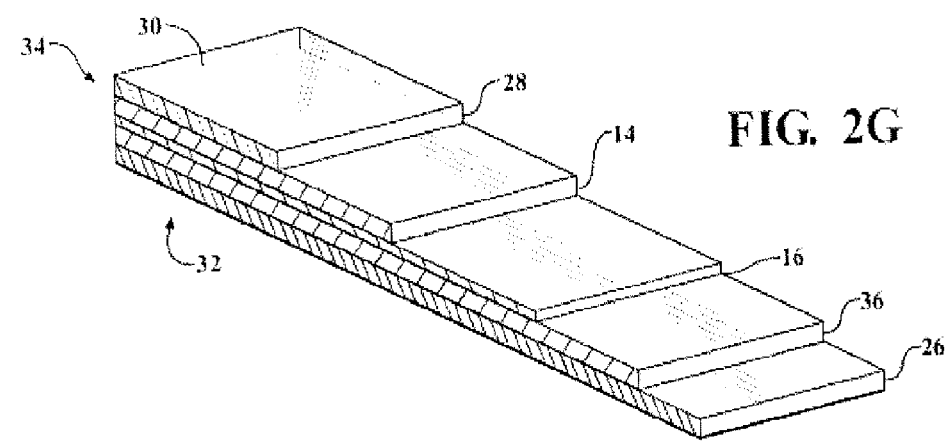
FIG. 2G is a cross-sectional view of one embodiment of a photovoltaic cell module relating to FIG. 1G.

The present invention provides an electronic article (10) and a method of forming the article. The article includes an optoelectronic semiconductor (12) and an encapsulant (14) disposed on the optoelectronic semiconductor (12).

Optoelectronic Semiconductor:

The optoelectronic semiconductor (12) is typically a device that sources and/or detects and controls light such as visible light, gamma rays, x-rays, ultraviolet rays, and infrared rays. Accordingly, the electronic article (10) of this invention can be further defined as any article that includes an optoelectronic semiconductor (12) as known in the art and/or as described in greater detail below. Optoelectronic semiconductors (12) typically operate as electrical-to-optical or optical-to-electrical transducers. Typical, but non-limiting optoelectronic semiconductors (12) include photodiodes including solar cells, phototransistors, photomultipliers, integrated optical circuit (IOC) elements, photoresistors, photoconductive camera tubes, charge-coupled imaging devices, injection laser diodes, quantum cascade lasers, light-emitting diodes, photoemissive camera tubes, and the like. In one embodiment, the optoelectronic semiconductor (12) is further defined as a solar cell. In another embodiment, the optoelectronic semiconductor (12) is further defined as a light emitting diode.

The optoelectronic semiconductor (12) is not particularly limited and may be any known in the art. Typically, the optoelectronic semiconductor (12) has an electrical conductivity of from about $10^3$ S/cm to about $10^{-8}$ S/cm. In one embodiment, the optoelectronic semiconductor (12) includes silicon. In other embodiments, the optoelectronic semiconductor (12) includes arsenic, selenium, tellurium, germanium, gallium arsenide, silicon carbide, and/or elements from Groups IV, III-V, II-VI, I-VII, IV-VI, V-VI, and II-V, and may be of p- or n-type. It is contemplated that the optoelectronic semiconductor (12) may be disposed on a substrate (26), as described in greater detail below, using chemical vapor deposition (CVD).

The optoelectronic semiconductor (12) has a first side and a second side. Typically the first side is opposite the second side. However, the first and second sides may be adjacent each other. In various embodiments, one or more of electrical leads are attached to one or both of the first and second sides to connect a series of optoelectronic semiconductors (12) together. The electrical leads may be of any size and shape and typically are rectangular-shaped. In one embodiment, the electrical leads have dimensions of approximately 0.005 to 0.080 inches in length and/or width. In other embodiments, the electrical leads have a thickness of from 0.005 to 0.015, from 0.005 to 0.010, or from 0.007 to 0.010, inches. The electrical leads may be of any type known in the art and may be disposed on any portion of the optoelectronic semiconductor (12).

Typically, one electrical lead acts as an anode while another electrical lead acts as a cathode. In various embodiments, the optoelectronic semiconductor (12) includes one or more electrical leads disposed thereon, e.g. first, second, third, and fourth electrical leads. These electrical leads may be the same or may be different from each other (i.e., made from the same material or from different materials) and may include metals, conducting polymers, and combinations thereof. In one embodiment, the one or more electrical leads include tin-silver solder coated copper. In another embodiment, the one or more electrical leads include tin-lead solder coated copper. The optoelectronic semiconductor (12) itself is not limited in size or shape and may be any size or shape known in the art.

Encapsulant:

Referring back, the electronic article (10) also includes the encapsulant (14) that is disposed on the optoelectronic semiconductor (12). The terminology "disposed on" includes the encapsulant (14) disposed on and in direct contact with the optoelectronic semiconductor (12). This terminology also includes the encapsulant (14) spaced apart from the optoelectronic semiconductor (12) yet still disposed thereon. The encapsulant (14) may be disposed on the optoelectronic semiconductor (12) such that only one side of the optoelectronic semiconductor (12) is covered. Alternatively, the encapsulant (14) may partially or entirely encapsulate the optoelectronic semiconductor (12) or any other component described herein. In various embodiments, the encapsulant (14) is a sheet, gel, film, paste, or liquid. Most typically, the encapsulant (14) is a sheet or a film.

The encapsulant (14) may include, consist essentially of, or consist of an organosiloxane block copolymer. In one embodiment, the encapsulant (14) consists essentially of the organosiloxane block copolymer and does not include other polymers. The organosiloxane block copolymer includes 65 to 90 mol % of diorganosiloxane units having the formula $R^1_2SiO_{2/2}$ (I). In various embodiments the organosiloxane block copolymer includes from 65 to 70, from 70 to 75, from 75 to 80, from 80 to 85, from 85 to 90, from 70 to 90, from 75 to 85, etc, mole % of diorganosiloxane units having the formula $R^1_2SiO_{2/2}$ (I). The mole % of the diorganosiloxane units having the formula $R^1_2SiO_{2/2}$ (I) may be any value or range of values, both whole and fractional, within those ranges and values described above and/or may vary from the values and/or range of values above by ±5%, ±10%, ±15%, ±20%, ±25%, ±30%, etc.

These diorganosiloxane units are arranged in linear blocks having an average of from 10 to 400 diorganosiloxane units per linear block. In various embodiments, these units are arranged in linear blocks having an average of from 20 to 390, 30 to 380, 40 to 370, 50 to 360, 60 to 350, 70 to 340, 80 to 330, 90 to 320, 100 to 310, 200 to 300, 210 to 290, 220 to 280, 230 to 270, 240 to 260, or about 250, diorganosiloxane units per linear block. Of course, the average may be any value or range of values, both whole and fractional, within those ranges and values described above and/or may vary from the values and/or range of values above by ±5%, ±10%, ±15%, ±20%, ±25%, ±30%, etc.

The organosiloxane block copolymer also includes 10 to 35 mol % of siloxane units having the average formula $R^2_x(OR^3)_ySiO_{(4-x-y)/2}$ (II). In various embodiments the organosiloxane block copolymer includes from 10 to 15, from 15 to 20, from 20 to 25, from 25 to 30, from 30 to 35, from 20 to 30, from 15 to 30, etc, mole % of siloxane units having the average formula $R^2_x(OR^3)_ySiO_{(4-x-y)/2}$ (II) The mole % of the siloxane units having the average formula $R^2_x(OR^3)_ySiO_{(4-x-y)/2}$ (II) may be any value or range of values, both whole and fractional, within those ranges and values described above and/or may vary from the values and/or range of values above by ±5%, ±10%, ±15%, ±20%, ±25%, ±30%, etc.

The siloxane units are arranged in nonlinear blocks having at least 2 siloxane units per nonlinear block wherein $0.5 \leq x \leq 1.5$ and $0 \leq y \leq 1$. Again, the values for x and y may independently be any value or range of values, both whole and fractional, within those ranges and values described above.

In addition, relative to both (I) and (II) above, each $R^1$ is independently a $C_1$ to $C_{10}$ hydrocarbyl, each $R^2$ is independently an aryl or $C_4$ to $C_{10}$ hydrocarbyl, at least 50 mol % of $R^2$ are aryl, and each $R^3$ is independently $R^1$ or H. It is to be understood that one or more of $R^1$, $R^2$, and/or $R^3$ may independently be a hydrocarbyl having any number of carbon atoms between 1 and 10 as described above, e.g. 2, 3, or 4 carbons atoms, etc.

In one embodiment, the diorganosiloxane units having the formula $R^1_2SiO_{2/2}$ (I) are present in an amount of from 79 to 89 mol %. In another embodiment, the siloxane units having the average formula $R^2_x(OR^3)_ySiO_{(4-x-y)/2}$ (II) are present in an amount of from 11 to 21 mol %. In still another embodiment, the linear blocks of (II) have an average of from 50 to 400 diorganosiloxane units per linear block. In still another embodiment, $0.8 \leq x \leq 1.2$ and $0 \leq y \leq 0.2$. In an even further embodiment, $R^1$ is methyl, each $R^2$ is aryl, and each $R^3$ is H.

In additional non-limiting embodiments of this invention, the organosiloxane block copolymer is heat processable and curable and includes linear dimethylsiloxane soft blocks and resinous silsesquioxane hard blocks including aromatic (e.g. phenyl) moieties. In one embodiment, the organosiloxane block copolymer is segmented and includes low levels of unreacted silsesquioxane resins and linear dimethylsiloxane homopolymers. In still another embodiment, the organosiloxane block copolymer is cured or partially cured to form an optically clear film or sheet that is both tough and elastomeric. This film or sheet may be utilized as a front encapsulant, back encapsulant, and/or backsheet replacement which are terms known in the art. In still other embodiments, the organosiloxane block copolymer is designed to flow and cure upon heating but are stable at room temperature.

In yet another embodiment, the organosiloxane block copolymer includes a silsesquioxane resin that is incompatible with a linear siloxane chain. End groups on the linear siloxane chain are typically different from, and reactive towards, functionality on the silsesquioxane resin. As just one example, the linear siloxane chain can be capped using silanes, e.g. oximo-silane and acetoxy-silanes, and further reacted with silanol functional resins including phenyl moieties, as described in various embodiments of the method below. In a further embodiment, PDMS capped with oximo-silane is reacted with phenyl silsesquioxane (Phenyl-T) to form an elastomer.

In still other embodiments, phenyl moieties in the siloxane of formula (II) contribute to "hot melt" behavior of the organosiloxane block copolymer. Without intending to be bound by any particular theory, it is believed that the hot-melt behavior and the phenyl moieties allow the organosiloxane block copolymer to be approximately tack-free during storage and before application (e.g. at a temperature below a glass transition of the siloxane of formula (II)) and flowable upon application (e.g. using lamination at a temperature above the glass transition of the siloxane of formula (II).) In addition, the organosiloxane block copolymer may be formed in the absence of fillers including, but not limited to, reinforcing fillers, semi-reinforcing fillers, and/or non-reinforcing fillers, either separately or in one or more combinations.

Moreover, the organosiloxane block copolymer has a light transmittance of at least 95%. In other embodiments, the organosiloxane block copolymer has a light transmittance of at least 96%, 97%, 98%, or 99% or about 100%. The light transmittance is typically determined using ASTM E-903-96 or a modified version of ASTM D1003 which specifies how to measure light transmittance using a class C light source. In the modified version, the class C light source is replaced with a light source that produces the solar spectrum (i.e., the AM 1.5 G spectrum). Spectral transmittance values are also independent of reflective losses in the modified method in contrast to ASTM D1003. Measurements are acquired using a Varian Cary 5000 between 200-1700 nm.

The electronic article (10) may include multiple encapsulants, e.g. a second and/or a third encapsulant and/or one or more layers of the encapsulant (14), second encapsulant, third encapsulant, etc. Any second, third, or additional encapsulant may be the same or different from the (first) encapsulant (14) described above and may be included in the electronic article (10) independently or as a mixture with the (first) encapsulant (14). In one embodiment, the electronic article (10) includes the (first) encapsulant (14) described above and a second encapsulant. Further, the encapsulant (14) may be transparent to UV and/or visible light and the second (or additional) encapsulants may be transparent to UV and/or visible light, impermeable to light, or opaque.

Substrate/Superstrate:

The electronic article (10) may also include a substrate (26) and/or a superstrate (28). Typically, the substrate (26) provides protection to a rear surface (32) of the electronic article (10) while a superstrate (28) typically provides protection to a front surface (30) of the electronic article (10). The substrate (26) and the superstrate (28) may be the same or may be different and each may independently include any suitable material known in the art. The substrate (26) and/or superstrate (28) may be soft and flexible or may be rigid and stiff. Alternatively, the substrate (26) and/or superstrate (28) may include rigid and stiff segments while simultaneously including soft and flexible segments. The substrate (26) and/or superstrate (28) may be transparent to light, may be opaque, or may not transmit light (i.e., may be impervious to light). Typically, the superstrate transmits light. In one embodiment, the substrate (26) and/or superstrate (28) includes glass. In another embodiment, the substrate (26) and/or superstrate (28) includes metal foils, polyimides, ethylene-vinyl acetate copolymers, and/or organic fluoropolymers including, but not limited to, ethylene tetrafluoroethylene (ETFE), Tedlar®, polyester/Tedlar®, Tedlar®/polyester/Tedlar®, polyethylene terephthalate (PET) alone or coated with silicon and oxygenated materials ($SiO_X$), and combinations thereof. In one embodiment, the substrate (26) is further defined as a PET/$SiO_x$-PET/Al substrate (26), wherein x has a value of from 1 to 4.

The substrate (26) and/or superstrate (28) may be load bearing or non-load bearing and may be included in any portion of the electronic article (10). Typically, the substrate (26) is load bearing. The substrate (26) may be a "bottom layer" of the electronic article (10) that is typically positioned behind the optoelectronic semiconductor (12) and serves as mechanical support. Alternatively, the electronic article (10) may include a second or additional substrate (26) and/or superstrate (28). The substrate (26) may be the bottom layer of the electronic article (10) while a second substrate (26) may be the top layer and function as the superstrate (28). Typically, the second substrate (26) (e.g. a second substrate (26) functioning as a superstrate (28) is transparent to the solar spectrum (e.g. visible light) and is positioned on top of the substrate (26). The second substrate (26) may be positioned in front of a light source. The second substrate (26) may be used to protect the electronic article (10) from environmental conditions such as rain, show, and heat. Most typically, the second substrate (26) functions as a superstrate (28) and is a rigid glass panel that is transparent to sunlight and is used to protect the front surface (30) of the electronic article (10).

In one embodiment, the organosiloxane block copolymer may be used as a substrate (26) and/or superstrate (28). In another embodiment, the substrate (26) and/or superstrate (28) is as described in PCT Patent Application No. PCT/US2009/062513, which is expressly incorporated herein by reference. In this embodiment, the substrate (26) and/or superstrate (28) may include a plurality of coated fibers. The plurality of fibers may be coated as described in the PCT/US2009/062513 and/or coated with the organosiloxane block copolymer of this invention.

The substrate (26) and/or superstrate (28) typically have a thickness of from 50 to 500, of from 100 to 225, or of from 175 to 225, micrometers. The substrate (26) and/or superstrate (28) may have a length and width of 125 mm each or a length and width of 156 mm each. of course, the invention is not limited to these thicknesses or ranges thereof and the thickness of the substrate (26) and/or superstrate (28) may be any value or range of values, both whole and fractional, within those ranges and values described above or different therefrom. It is also contemplated that the thickness, length, and/or width of the substrate (26) and/or superstrate (28) may vary from the values and/or range of values above by ±5%, ±10%, ±15%, ±20%, ±25%, ±30%, etc.

Tie Layer:

In addition, the electronic article (10) may also include one or more tie layers (18). The one or more tie layers (18) may be disposed on the substrate (26) to adhere the optoelectronic semiconductor (12) to the substrate (26). In one embodiment, the electronic article (10) does not include a substrate (26) and does not include a tie layer (18). In another embodiment, the electronic article (10) does not include a substrate (26), as described above, but includes a tie layer (18) as an outermost layer of the electronic article (10). In this embodiment, the tie layer (18) may act as a substrate (26). In various other embodiments, the electronic article (10) includes multiple tie layers, e.g. second, and/or third tie layers. Any second, third, or additional tie layer (18) may be the same or different from the (first) tie layer (18). Thus, any second, third or additional tie layer may be formed from the same material or from a different material than the (first) tie layer (18). The second tie layer may be disposed on the (first) tie layer (18) and/or may be disposed on the optoelectronic semiconductor (12). The one or more tie layers (18) are each typically transparent to UV and/or visible light. However, one or more of the tie layers (18) may be impermeable to light or opaque. In one embodiment, the tie layer (18) has high transmission across visible wavelengths, long term stability to UV and provides long term protection to the optoelectronic semiconductor (12). In this embodiment, there is no need to dope the substrate (26) with cerium due to the UV stability of the tie layer (18). In various other embodiments, the tie layer (18) is as described in PCT Patent Application No. PCT/US09/01623, which is expressly incorporated herein by reference.

The tie layer (18) is typically tacky and may be a gel, gum, liquid, paste, resin, or solid. In one embodiment, the tie layer (18) is a film. In another embodiment, the tie layer (18) is a gel. In yet another embodiment, the tie layer (18) is a liquid that is cured (e.g. pre-cured) to form a gel. Alternatively, the tie layer (18) may include multiple segments, with each segment including a different composition and/or different form (e.g., gel and liquid). Examples of suitable gels for use as the tie layer (18) are described in U.S. Pat. Nos. 5,145,933, 4,340,709, and 6,020,409, each of which is expressly incorporated herein by reference relative to these gels. The tie layer (18) also typically has an elastic modulus (G' at cure) of from $7 \times 10^2$ to $6 \times 10^5$, dynes/$cm^2$. Alternatively, the tie layer (18) may have the same composition as the encapsulant (14) described above.

The tie layer (18) is not particularly limited in thickness but typically have a thickness of from 1 to 50, more typically from 3 to 30, and most typically of from 4 to 15, mils. In various embodiments, the tie layer (18) has a thickness of from 1 to 30, from 1 to 25, from 1 to 20, from 3 to 17, from 5 to 10, from 5 to 25, from 10 to 15, from 10 to 17, from 12 to 15, from 10 to 30, or from 5 to 20, mils. Of course, the invention is not limited to these thicknesses or ranges thereof and the thickness of the tie layer (18) may be any value or range of values, both whole and fractional, within those ranges and values described above. It is also contemplated that the thickness of the tie layer (18) may vary from the values and/or range of values above by ±5%, ±10%, ±15%, ±20%, ±25%, ±30%, etc.

Anti-Reflective Coating:

The electronic article (10) may also include an antireflective coating (ARC) (16) and/or a gradient refractive index coating (GRIC). In one embodiment, the GRIC is disposed on the optoelectronic semiconductor (12). Examples of suitable GRICs are described in the U.S. Provisional Patent Application No. 61/385,446, filed on Sep. 22, 2010, entitled "ELECTRONIC ARTICLE AND METHOD OF FORMING," and expressly incorporated herein by reference.

Method of Forming the Organosiloxane Block Copolymer:
Oxime Chemistry Focus:

The organosiloxane block copolymer of this invention may be formed by any method. In one embodiment, the method is focused on oxime chemistry and includes the step of reacting (a) a linear organosiloxane having the formula $R^1(Z=N-O)_2SiO(R^1_2SiO_{2/2})_nSi(O-N=Z)_2R^1$ (III) and (b) an organosiloxane resin having the average unit formula $R^2_x(OR^3)_ySiO_{(4-x-y)/2}$ (II) in (c) an organic solvent to form the organosiloxane block copolymer. In these formulae, Z is $=CR^1_2$ or $=CR^4$, $R^4$ is hydrocarbylene, n has an average value of from 100 to 400, $0.5 \leq x \leq 1.5$ and $0 \leq y \leq 1$. It is to be appreciated that each $R^1$, $R^2$ and $R^3$ is described as above and independently selected. In various embodiments, n has an average value of from 20 to 390, 30 to 380, 40 to 370, 50 to 360, 60 to 350, 70 to 340, 80 to 330, 90 to 320, 100 to 310, 200 to 300, 210 to 290, 220 to 280, 230 to 270, 240 to 260, or about 250. The average value of n may be any value or range of values, both whole and fractional, within those ranges and values described above and/or may vary from the values and/or range of values above by ±5%, ±10%, ±15%, ±20%, ±25%, ±30%, etc.

Organosiloxane resins suitable for use herein may have the average unit formula $R^2_x(OR^3)_ySiO_{(4-x-y)/2}$. The molecular weight ($M_w$) of the (b) organosiloxane resin is not limiting, but typically ranges from 1000 to 10,000, or alternatively 1500 to 5000 g/mol. In one embodiment, the (b) organosiloxane resin is a silsesquioxane. The (b) organosiloxane resins suitable for use in the present process typically have a silanol content of at least 5 mole %, alternatively of at least 10 mole %, alternatively 25 mole %, alternatively 40 mole %, or alternatively 50 mole %.

Suitable (b) organosiloxane resins may be prepared by hydrolyzing an organosilane having three hydrolyzable groups on the silicon atom, such as a halogen or alkoxy group in an organic solvent. A representative example for the preparation of a silsesquioxane resin may be found in U.S. Pat. No. 5,075,103, which is expressly incorporated herein by reference. Furthermore, many suitable (b) organosiloxane resins are available commercially and sold either as a solid (flake or powder), or dissolved in an organic solvent. Suitable, non-limiting, commercially available (b) organosiloxane resins include; Dow Corning® 217 Flake Resin, 233 Flake, 220 Flake, 249 Flake, 255 Flake, Z-6018 Flake (Dow Corning Corporation, Midland Mich.).

One skilled in the art further recognizes that (b) organosiloxane resins containing such high amounts of $[R^2SiO_{3/2}]$ siloxy units and silanol contents may also retain water molecules, especially in high humidity conditions. Thus, it is often beneficial to remove excess water present on the resin by "drying" the (b) organosiloxane resin prior to use in the present process. This may be achieved by dissolving the (b) organosiloxane resin in an organic solvent, heating to reflux, and removing water by separation techniques (for example Dean Stark trap or equivalent process).

In one embodiment, the method further includes the step of removing the (c) organic solvent. In still another embodiment, the method includes the step of reacting the organosiloxane block copolymer with an alcohol having from 1 to 10 carbon atoms to form an alkoxy-capped organosiloxane block copolymer. In this embodiment, the alcohol is not particularly limited any may include any known in the art. In one embodiment, the alcohol has from 1 to 10 carbon atoms. In another embodiment, the alcohol is further defined as butanol. It is to be understood that the alcohol may have any number of carbon atoms between 1 and 10 and may have any structure or isomeric structure thereof.

In one embodiment, the (a) linear organosiloxane is reacted in an amount of from 65 to 90 mol % with the (b) organosiloxane resin in an amount of from 10 to 35 mol %. In another embodiment, the (a) linear organosiloxane is reacted in an amount of from 79 to 89 mol % with the (b) organosiloxane resin in an amount of from 11 to 21 mol %. In still another embodiment, the (a) linear organosiloxane is reacted in an amount of from 75 to 89 mol % with the (b) organosiloxane resin in an amount of from 15 to 21 mol %. Of course, the invention is not limited to these amounts or ranges and the (a) linear organosiloxane may be reacted with the (b) organosiloxane resin in any amount or range of amounts, both whole and fractional, within those ranges and amounts described above. It is also contemplated that the (a) linear organosiloxane may be reacted with the (b) organosiloxane resin in amounts that may vary from the amounts and/or range of amounts above by ±5%, ±10%, ±15%, ±20%, ±25%, ±30%, etc.

The reaction conditions for reacting the aforementioned (a) linear organosiloxane with the (b) organosiloxane resin are not particularly limited. Various non-limiting embodiments and reaction conditions are described in the Examples below. In some embodiments, the (a) linear organosiloxane and the (b) organosiloxane resin are reacted at room temperature. In other embodiments, (a) and (b) are reacted at temperatures that exceed room temperature and that range up to about 35, 40, 45, 50, or even up to 100° C. Alternatively, (a) and (b) can be refluxed, either together or separately. In still other embodiments, (a) and (b) are reacted at temperatures that are below room temperature by 5, 10, or even more than 10° C. In still other embodiments (a) and (b) react for times of 1, 5, 10, 30, 60, 120, or 180 minutes, or even longer. Typically, (a) and (b) are reacted under an inert atmosphere, such as nitrogen or a noble gas. Alternatively, (a) and (b) may be reacted under an atmosphere that includes some water vapor and/or oxygen. Moreover, (a) and (b) may be reacted in any size vessel and using any equipment including mixers, vortexers, stirrers, heaters, etc. In still other embodiments, (a) and (b) are reacted in one or more organic solvents which may be polar or non-polar. Typically, solvents such as toluene, benzene, and the like are utilized. It is to be understood that the aforementioned reaction conditions are not limiting and that any one or more of the reaction conditions described above or in the Examples may be any value or range of values, both whole and fractional, within those ranges and values described above and/or may vary from the values and/or range of values above by ±5%, ±10%, ±15%, ±20%, ±25%, ±30%, etc.

Acetoxy Chemistry Focus:

In another embodiment, the method is focused on acetoxy chemistry and includes the step of reacting (d) a linear organosiloxane having the formula $R^1[R^1C(=O)O]_2OSi$ $(R^1_2SiO_{2/2})_n Si[O(O=)CR^1]_2 R^1$ with (b) an organosiloxane resin having the average unit formula $R^2_x(OR^3)_y SiO_{(4-x-y)/2}$ (II, as described above) in (c) the organic solvent to produce a first reaction product. In this embodiment, the method also includes the step of reacting the first reaction product with a silane having the formula $R^5_q SiX_{4-q}$ to form the organosiloxane block copolymer wherein $R^5$ is a $C_1$ to $C_8$ hydrocarbyl or a $C_1$ to $C_8$ halogen-substituted hydrocarbyl, X is a hydrolysable group, and q is 0, 1, or 2. In another embodiment, the method includes the step of removing the (c) organic solvent. In still another embodiment, the method further includes the step of reacting the organosiloxane block copolymer with an alcohol, as described above, to form an alkoxy-capped organosiloxane block copolymer. It is to be understood that the hydrocarbyl or halogen-substituted hydrocarbyl may have any number of carbon atoms between 1 and 8 and is not particularly limited.

In one embodiment, the (d) linear organosiloxane is reacted in an amount of from 65 to 90 mol % with the (b) organosiloxane resin in an amount of from 10 to 35 mol % to produce the first reaction product. In another embodiment, the (d) linear organosiloxane is reacted in an amount of from 79 to 89 mol % with the (b) organosiloxane resin in an amount of from 11 to 21 mol % to produce the first reaction product. In still another embodiment, the (d) linear organosiloxane is reacted in an amount of from 79 to 85 mol % with the (b) organosiloxane resin in an amount of from 15 to 21 mol % to produce the first reaction product. The invention is not limited to these amounts or ranges and the (d) linear organosiloxane may be reacted with the (b) organosiloxane resin in any amount or range of amounts, both whole and fractional, within those ranges and amounts described above. It is also contemplated that the (d) linear organosiloxane may be reacted with the (b) organosiloxane resin in amounts that may vary from the amounts and/or range of amounts above by ±5%, ±10%, ±15%, ±20%, ±25%, ±30%, etc.

In still another embodiment, the first reaction product is reacted in an amount of from 90 to 99.9 mol % with the silane in an amount of from 0.1 to 10 mol %. Alternatively, the first reaction product may be reacted in an amount of from 95 to 99.5 mol %, of from 95 to 98 mol %, or of from 96 to 98 mol %, with the silane in an amount of from 0.5 to 5 mol %, of from 2 to 5 mol %, or of from 2 to 4 mol %. Just as above, the invention is not limited to these amounts or ranges and the first reaction product may be reacted with the silane in any amount or range of amounts, both whole and fractional, within those ranges and amounts described above. It is also contemplated that the first reaction product may be reacted with the silane in amounts that may vary from the amounts and/or range of amounts above by ±5%, ±10%, ±15%, ±20%, ±25%, ±30%, etc.

The reactions conditions for the acetoxy chemistry focus may be the same or different from those reactions conditions described above. In addition, many non-limiting examples of reaction conditions are set forth in the Examples below. Just as above, it is to be understood that the aforementioned reaction conditions are not limiting and that any one or more of the reaction conditions described above or in the Examples may be any value or range of values, both whole and fractional, within those ranges and values described above and/or may vary from the values and/or range of values above by ±5%, ±10%, ±15%, ±20%, ±25%, ±30%, etc.

Electronic Article:

Referring back to the article (10) itself, the article (10) is not particularly limited and, in one embodiment, is further defined as a photovoltaic cell module (34). In an alternative embodiment, the article (10) is further defined as a solid state light or as solid state lighting. Each of these embodiments, and non-limiting variants thereof, are described in greater detail immediately below.

Photovoltaic Cell Module:

As is known in the art, photovoltaic cell modules (hereinafter referred to as "modules" (34)) convert light energy into electrical energy due to a photovoltaic effect. More specifically, modules (34) perform two primary functions. A first function is photogeneration of charge carriers such as electrons and holes in optoelectronic semiconductors (12) (such as photovoltaic cells (36), as are described in greater detail below. The second function is direction of the charge carriers to a conductive contact to transmit electricity.

In one embodiment, the electronic article (10) is further defined as a module (34) that includes the photovoltaic cell (36) as the optoelectronic semiconductor (12) and that also includes the encapsulant (14). The module (34) may also include one or more of the substrate (26), superstrate (28), or other components described above.

In one embodiment, the photovoltaic cell (36) is disposed on the substrate (26) via chemical vapor deposition or sputtering. Typically, in this embodiment, no tie layer (18) is required between the photovoltaic cell (36) and the substrate (26). This embodiment is typically referred to as a "thin-film" application. After the photovoltaic cell (36) is disposed on the substrate (26) using sputtering or chemical vapor deposition processing techniques, one or more electrical leads (not shown in the Figures) may be attached to the photovoltaic cell (36). The encapsulant (14) may then be applied over the electrical leads.

The photovoltaic cell (36) typically has a thickness of from 50 to 250, more typically of from 100 to 225, and most typically of from 175 to 225, micrometers. The photovoltaic cell (36) also typically has a length and width (not shown in the Figures) of from 100×100 cm to 200×200 cm. In one embodiment, the photovoltaic cell (36) has a length and width of 125 cm each. In another embodiment, the photovoltaic cell (36) has a length and width of 156 cm each. Of course, the invention is not limited to these thicknesses or ranges thereof and the thickness of the photovoltaic cell (36) may be any value or range of values, both whole and fractional, within those ranges and values described above. It is also contemplated that the thickness of the photovoltaic cell (36) may vary from the values and/or range of values above by ±5%, ±10%, ±15%, ±20%, ±25%, ±30%, etc.

The photovoltaic cell (36) may include large-area, single-crystal, single layer p-n junction diodes. These photovoltaic cells (36) are typically made using a diffusion process with silicon wafers. Alternatively, the photovoltaic cell (36) may include thin epitaxial deposits of (silicon) semiconductors on lattice-matched wafers. In this embodiment, the epitaxial photovoltaics may be classified as either space or terrestrial and typically have AM0 efficiencies of from 7 to 40%. Further, the photovoltaic cell (36) may include quantum well devices such as quantum dots, quantum ropes, and the like, and also include carbon nanotubes. Without intending to be limited by any particular theory, it is believed that these types of photovoltaic cells (36) can have up to a 45% AM0 production efficiency.

The photovoltaic cell (36) may include amorphous silicon, monocrystalline silicon, polycrystalline silicon, microcrystalline silicon, nanocrystalline silica, cadmium telluride, copper indium/gallium selenide/sulfide, gallium arsenide, polyphenylene vinylene, copper phthalocyanine, carbon fullerenes, and combinations thereof in ingots, ribbons, thin films, and/or wafers. The photovoltaic cell (36) may also include light absorbing dyes such as ruthenium organometallic dyes. Most typically, the photovoltaic cell (36) includes monocrystalline and polycrystalline silicon. It is also contemplated that any part of the description of the photovoltaic cell (36) of this embodiment may also apply to any one or more of the electronic articles (10) described above.

Figure 3A:
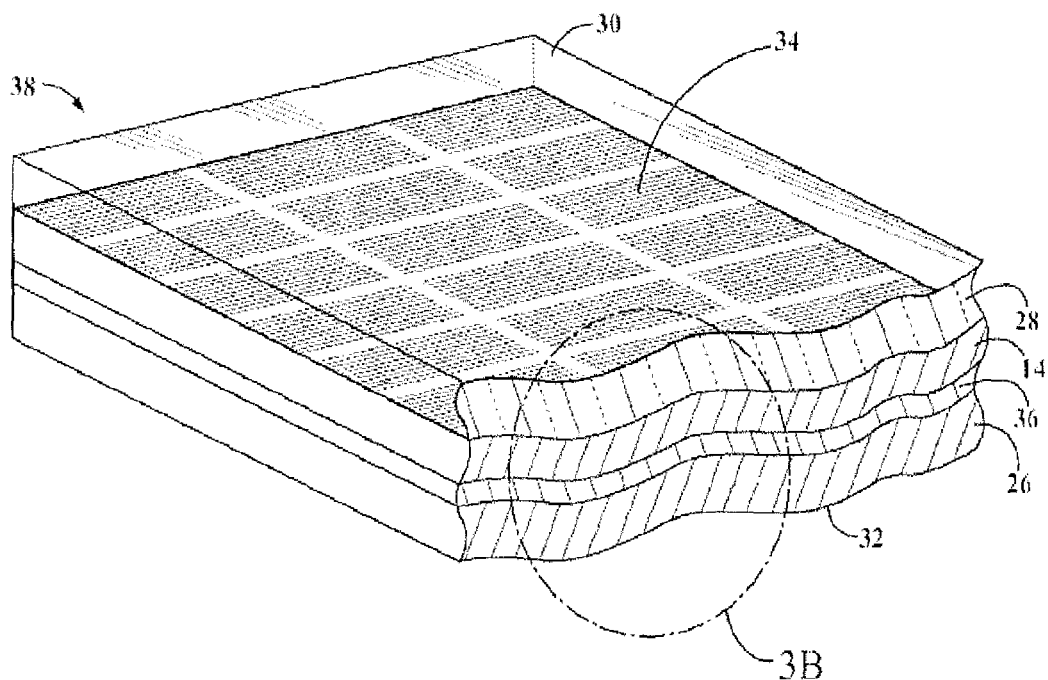
FIG. 3A is a cross-sectional view of a series of photovoltaic cell modules of FIG. 2D that are electrically connected and arranged as a photovoltaic array.
Figure 3B:
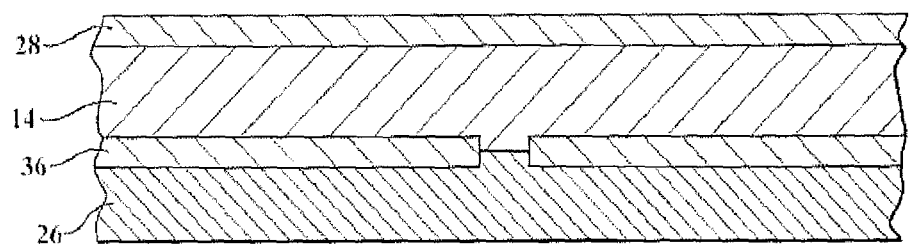
FIG. 3B is a magnified cross-sectional view of the series of photovoltaic cell modules of FIG. 2D that are electrically connected and arranged as a photovoltaic array.
Figure 4:
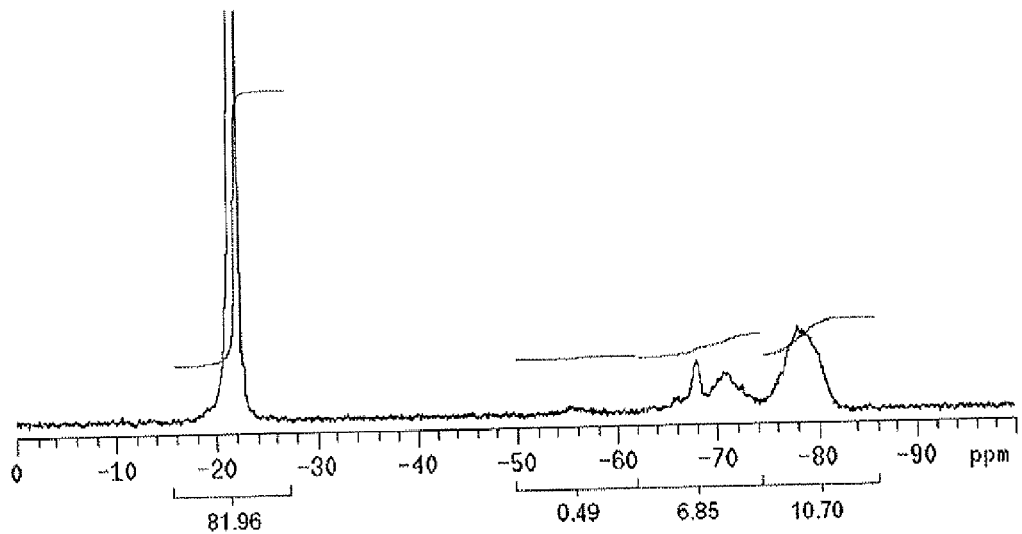
FIG. 4 is a silicon NMR spectrum of the organosiloxane block copolymer of Example 2.

The module (34) of the instant invention can be used in any industry including, but not limited to, automobiles, small electronics, remote area power systems, satellites, space probes, radiotelephones, water pumps, grid-tied electrical systems, batteries, battery chargers, photoelectrochemical applications, polymer solar cell applications, nanocrystal solar cell applications, and dye-sensitized solar cell applications. In one embodiment, a series of modules (34) are electrically connected and form a photovoltaic array (38), as set forth in FIGS. 3A and 3B. The instant invention also provides the photovoltaic array (38) itself. The photovoltaic array (38) includes at least two modules (34). Photovoltaic arrays (38) are typically used on rooftops, in rural areas connected to battery backups, and in DC pumps, signal buoys, and the like. The photovoltaic array (38) of the instant invention may be planar or non-planar and typically functions as a single electricity producing unit wherein the modules (34) are interconnected in such a way as to generate voltage. Typically the modules (34) are electrically connected, as described above, to provide suitable voltage. The photovoltaic array (38) may be of any size and shape and may be utilized in any industry.

Solid State Lighting:

As first introduced above, the electronic article (10) can alternatively be further defined as a solid state light, or as solid state lighting, such as light emitting diodes (LEDs). As is known in the art, LEDs typically generate light in a forward biased state when electrons recombine with holes formed in optoelectronic semiconductors (12). When the electrons recombine, they release photons in a process typically described as electroluminescence. The solid state lighting can be used in any application including, but not limited to, instrument panels & switches, courtesy lighting, turn and stop signals, household appliances, VCR/DVD/stereo/audio/video devices, toys/games instrumentation, security equipment, switches, architectural lighting, signage (channel letters), machine vision, retail displays, emergency lighting, neon and bulb replacement, flashlights, accent lighting full color video, monochrome message boards, in traffic, rail, and aviation applications, in mobile phones, PDAs, digital cameras, lap tops, in medical instrumentation, bar code readers, color & money sensors, encoders, optical switches, fiber optic communication, and combinations thereof.

EXAMPLES

A series of organosiloxane block copolymers (Copolymers) are formed according to this invention. A series of comparative copolymers (Comparative Copolymers) are also formed as control examples but do not represent this invention.

Generalized Reaction Scheme—Oxime-Capping of Linear Silanol Terminated PDMS:

A solution of toluene and silanol terminated PDMS is formed and the silanol terminated PDMS is capped with methyltris(methylethylketoxime)silane (MTO) in a glove box under nitrogen by adding the MTO to the silanol terminated PDMS and mixing at room temperature for 2 hours to form oxime-terminated PDMS.

Generalized Reaction Scheme—Acetoxy-Capping of Linear Silanol Ended PDMS:

A solution of toluene and silanol terminated PDMS is formed and the silanol terminated PDMS is capped with alkyltriacetoxysilane in a glove box under nitrogen by adding the alkyltriacetoxysilane to the silanol terminated PDMS and mixing at room temperature for 2 hours to form acetoxy-terminated PDMS.

Example 1

Formation of Organosiloxane Block Copolymer Using Oxime Terminated PDMS

In a first example, an organosiloxane block copolymer is formed using oxime terminated PDMS and has approximately 11 mol % of Phenyl-T units which corresponds to about 20 wt % of Phenyl-T units. More specifically, a 1 L 3-neck round bottom flask is loaded with a phenylsilsesquioxane hydrolyzate (Dow Corning 217 Flake, 24 g, 0.175 mol Si) and toluene (Fisher Scientific, 80 g) to form a mixture. The flask is equipped with a thermometer, Teflon stir paddle, and a Dean Stark apparatus pre-filled with toluene and attached to a water-cooled condenser. A nitrogen blanket is then applied. An oil bath is used for heating.

The mixture is heated at reflux for 30 min and subsequently cooled to 100° C. At this point, a solution of oxime capped PDMS, formed using the method described above, is added. More specifically, the oxime capped PDMS is formed using 200 g toluene, 96 g silanol terminated PDMS, Gelest DMS-S27 184 dp and 4.46 g MTO from Gelest. The oxime-PDMS is added quickly to the phenylsilsesquioxane hydrolyzate at 100° C., heated at reflux for 2.5 hrs after which n-butanol (12 g, Fisher Scientific) is added and further heated at reflux for another 3 hrs. At this point, some volatiles are then removed by distillation to increase a solids content to about 40 wt %. Subsequently, the mixture is cooled to room temperature. The organosiloxane block copolymer formed herein is optically clear and colorless. Cast sheets are then formed by pouring the organosiloxane block copolymer onto a flat surface and evaporating the solvent overnight at room temperature. The cast sheets appear optically hazy/cloudy. After formation, the organosiloxane block copolymer of this example is analyzed by $^{29}$Si NMR which confirms a structure of $(Me_2SiO_{2/2})_{0.880}(MeSiO_{3/2})_{0.010}(PhSiO_{3/2})_{0.0110}$ with 4.19 mol % $OR^3$, wherein $R^3$ is as described above.

Example 2

Formation of Organosiloxane Block Copolymer Using Oxime Terminated PDMS

In a second example, an organosiloxane block copolymer is formed using oxime terminated PDMS and has approximately 17 mol % of Phenyl-T units which corresponds to about 28 wt % of Phenyl-T units. More specifically, a 500 mL 3-neck round bottom flask is loaded with a phenylsilsesquioxane hydrolyzate (Dow Corning 217 Flake, 16.93 g, 0.124 mol Si) and toluene (Fisher Scientific, 51.4 g) to form a mixture. The flask is equipped with a thermometer, Teflon stir paddle, and a Dean Stark apparatus pre-filled with toluene and attached to a water-cooled condenser. A nitrogen blanket is then applied. An oil bath is used for heating.

The mixture is heated at reflux for 30 min and subsequently cooled to 100° C. At this point, a solution of oxime capped PDMS, formed using the method described above, is added. More specifically, the oxime capped PDMS is formed using 60 g toluene, 43.07 g silanol terminated PDMS, Gelest DMS-S27 184 dp and 2.00 g MTO from Gelest. The oxime-PDMS is added quickly to the phenylsilsesquioxane hydrolyzate at 100° C., heated at reflux for 1.75 hrs after which n-butanol (12 g, Fisher Scientific) is added and further heated at reflux for another 3 hrs. At this point, some volatiles are then removed by distillation to increase a solids content to about 40 wt %. Subsequently, the mixture is cooled to room temperature. The organosiloxane block copolymer formed herein is optically clear and colorless. Cast sheets are then formed by pouring the organosiloxane block copolymer onto a flat surface and evaporating the solvent overnight at room temperature. The cast sheets appear optically clear as well. After formation, the organosiloxane block copolymer of this example is analyzed by $^{29}$Si NMR which confirms a structure of $(Me_2SiO_{2/2})_{0.820}(MeSiO_{3/2})_{0.009}(PhSiO_{3/2})_{0.171}$ with 6.89 mol % $OR^3$, wherein $R^3$ is as described above.

Example 3

Formation of Organosiloxane Block Copolymer Using Oxime Terminated PDMS

In a third example, an organosiloxane block copolymer is formed using oxime terminated PDMS and has approximately 21 mol % of Phenyl-T units which corresponds to about 34 wt % of Phenyl-T units. More specifically, a 500 mL 3-neck round bottom flask is loaded with a phenylsilsesquioxane hydrolyzate (Dow Corning 217 Flake, 20.4, 0.149 mol Si) and toluene (Fisher Scientific, 61.2 g) to form a mixture. The flask is equipped with a thermometer, Teflon stir paddle, and a Dean Stark apparatus pre-filled with toluene and attached to a water-cooled condenser. A nitrogen blanket is then applied. An oil bath is used for heating.

The mixture is heated at reflux for 30 min and subsequently cooled to 100° C. At this point, a solution of oxime capped PDMS, formed using the method described above, is added. More specifically, the oxime capped PDMS is formed using 78.8 g toluene, 39.6 g silanol terminated PDMS, Gelest DMS-S27 184 dp and 1.84 g MTO from Gelest. The oxime-PDMS is added quickly to the phenylsilsesquioxane hydrolyzate at 100° C., heated at reflux for 2.5 hrs after which n-butanol (6 g, Fisher Scientific) is added and further heated at reflux for another 3 hrs. At this point, some volatiles are then removed by distillation to increase a solids content to about 40 wt %. Subsequently, the mixture is cooled to room temperature. The organosiloxane block copolymer formed herein is optically clear and colorless. Cast sheets are then formed by pouring the organosiloxane block copolymer onto a flat surface and evaporating the solvent overnight at room temperature. The cast sheets appear optically clear as well. After formation, the organosiloxane block copolymer of this example is analyzed by $^{29}$Si NMR which confirms a structure of $(Me_2SiO_{2/2})_{0.783}(MeSiO_{3/2})_{0.009}(PhSiO_{3/2})_{0.208}$ with 7.52 mol % $OR^3$, wherein $R^3$ is as described above.

Example 4

Formation of Organosiloxane Block Copolymer Using Oxime Terminated PDMS

In a fourth example, an organosiloxane block copolymer is formed using oxime terminated PDMS and has approximately 34 mol % of Phenyl-T units which corresponds to about 48 wt % of Phenyl-T units. More specifically, a 1 L 3-neck round bottom flask is loaded with a phenylsilsesquioxane hydrolyzate (Dow Corning 217 Flake, 57.6 g, 0.420 mol Si) and toluene (Fisher Scientific, 175.0 g) to form a mixture. The flask is equipped with a thermometer, Teflon stir paddle, and a Dean Stark apparatus pre-filled with toluene and attached to a water-cooled condenser. A nitrogen blanket is then applied. An oil bath is used for heating.

The mixture is heated at reflux for 30 min and subsequently cooled to 100° C. At this point, a solution of oxime capped PDMS, formed using the method described above, is added. More specifically, the oxime capped PDMS is formed using 105.0 g toluene, 62.4 g silanol terminated PDMS (Gelest DMS-521, 45 dp) and 11.7 g MTO from Gelest. The oxime-PDMS is added quickly to the phenylsilsesquioxane hydrolyzate at 100° C., heated at reflux for 1 hrs after which n-butanol (12.0 g, Fisher Scientific) is added and further heated at reflux for another 3 hrs. Subsequently, the mixture is cooled to room temperature. The organosiloxane block copolymer formed herein is optically clear. Cast sheets are then formed by pouring the organosiloxane block copolymer onto a flat surface and evaporating the solvent overnight at room temperature. The cast sheets appear optically clear. After formation, the organosiloxane block copolymer of this example is analyzed by $^{29}$Si NMR which confirms a structure of $(Me_2SiO_{2/2})_{0.633}(MeSiO_{3/2})_{0.029}(PhSiO_{3/2})_{0.338}$ with 16.0 mol % $OR^3$, wherein $R^3$ is as described above.

Example 5

Formation of Organosiloxane Block Copolymer Using Oxime Terminated PDMS

In a fifth example, an organosiloxane block copolymer is formed using oxime terminated PDMS and has approximately 18 mol % of Phenyl-T units which corresponds to about 28 wt % of Phenyl-T units. More specifically, a 500 mL 3-neck round bottom flask is loaded with a phenylsilsesquioxane hydrolyzate (Dow Corning 217 Flake, 16.8 g, 0.123 mol Si) and toluene (Fisher Scientific, 51.4 g) to form a mixture. The flask is equipped with a thermometer, Teflon stir paddle, and a Dean Stark apparatus pre-filled with toluene and attached to a water-cooled condenser. A nitrogen blanket is then applied. An oil bath is used for heating.

The mixture is heated at reflux for 30 min and subsequently cooled to 100° C. At this point, a solution of oxime capped PDMS, formed using the method described above, is added. More specifically, the oxime capped PDMS is formed using 60.0 g toluene, 43.2 g silanol terminated PDMS (Gelest DMS-521, 45 dp) and 8.10 g MTO from Gelest. The oxime-PDMS is added quickly to the phenylsilsesquioxane hydrolyzate at 100° C., heated at reflux for 30 minutes after which n-butanol (6.0 g, Fisher Scientific) is added and further heated at reflux for another 3 hrs. At this point, some volatiles are then removed by distillation to increase a solids content to about 40 wt %. Subsequently, the mixture is cooled to room temperature. The organosiloxane block copolymer formed herein is optically clear. Cast sheets are then formed by pouring the organosiloxane block copolymer onto a flat surface and evaporating the solvent overnight at room temperature. The cast sheets appear optically clear. The organosiloxane block copolymer of this example has a structure of approximately $(Me_2SiO_{2/2})_{0.82}(PhSiO_{3/2})_{0.18}$.

Example 6

Formation of Organosiloxane Block Copolymer Using Acetoxy Terminated PDMS

In a sixth example, an organosiloxane block copolymer is formed using oxime terminated PDMS and has approximately 17 mol % of Phenyl-T units which corresponds to about 28 wt % of Phenyl-T units. More specifically, In a further example, a 500 mL 3-neck round bottom flask is loaded with a phenylsilsesquioxane hydrolyzate (Dow Corning 217 Flake, 16.8 g, 0.123 mol Si) and toluene (Fisher Scientific, 60.0 g) to form a mixture. The flask is equipped with a thermometer, Teflon stir paddle, and a Dean Stark apparatus pre-filled with toluene and attached to a water-cooled condenser. A nitrogen blanket is then applied. An oil bath is used for heating.

The mixture is heated at reflux for 30 min and subsequently cooled to 108° C. At this point, a solution of acetoxy capped PDMS, formed using the method described above, is added. More specifically, the acetoxy capped PDMS is formed using 80.0 g toluene, 43.20 g silanol terminated PDMS (Dow Corning SFD750, 184 dp) and 1.54 g alkyltriacetoxysilane (ETS-900 from Dow Corning). The acetoxy-terminated PDMS is added quickly to the phenylsilsesquioxane hydrolyzate at 108° C., heated at reflux for 2 hours. At this stage, 2.5 g of ETS-900 is added and the mixture is refluxed for 1 hr. 40 ml of deionized water is then added and volatiles are removed through azeotropic distillation. Cast sheets are then formed by pouring the organosiloxane block copolymer onto a flat surface and evaporating the solvent overnight at room temperature. The cast sheets appear optically clear. The organosiloxane block copolymer of this example has a structure of approximately $(Me_2SiO_{2/2})_{0.82}(PhSiO_{3/2})_{0.17}$.

Comparative Examples

Comparative Example 1

6 mol % (10 wt %) Phenyl-T Units

In a first comparative example, an organosiloxane block copolymer is formed using oxime terminated PDMS and has approximately 6 mol % of Phenyl-T units which corresponds to about 10 wt % of Phenyl-T units. More specifically, a 1 L 3-neck round bottom flask is loaded with a phenylsilsesquioxane hydrolyzate (Dow Corning 217 Flake, 12 g, 0.0876 mol Si) and toluene (Fisher Scientific, 280 g) to form a mixture. The flask is equipped with a thermometer, Teflon stir paddle, and a Dean Stark apparatus pre-filled with toluene and attached to a water-cooled condenser. A nitrogen blanket is then applied. An oil bath is used for heating.

The mixture is heated at reflux for 30 min and subsequently cooled to 100° C. At this point, a solution of oxime capped PDMS, formed using the method described above, is added. More specifically, the oxime capped PDMS is formed using 200 g toluene, 108 g silanol terminated PDMS, Gelest DMS-S27 184 dp and 5 g MTO from Gelest. The oxime-PDMS is added quickly to the phenylsilsesquioxane hydrolyzate at 100° C., heated at reflux for 3.5 hrs after which n-butanol (12 g, Fisher Scientific) is added, further heated at reflux for another 3 hrs, and subsequently cooled to room temperature. The organosiloxane block copolymer formed herein is optically clear and colorless. Cast sheets are then formed by pouring the organosiloxane block copolymer onto a flat surface and evaporating the solvent overnight at room temperature. The cast sheets appear optically hazy/cloudy. After formation, the organosiloxane block copolymer of this example is analyzed by $^{29}Si$ NMR which confirms a structure of $(Me_2SiO_{2/2})_{0.945}(PhSiO_{3/2})_{0.044}$ with 0.49 mol % $OR^3$, wherein $R^3$ is as described above.

Comparative Example 2

41 mol % (55 wt %) Phenyl-T Units

In another comparative example, an organosiloxane block copolymer is formed using oxime terminated PDMS and has approximately 41 mol % of Phenyl-T units which corresponds to about 55 wt % of Phenyl-T units. More specifically, a 500 mL 3-neck round bottom flask is loaded with a phenylsilsesquioxane hydrolyzate (Dow Corning 217 Flake, 33.0, 0.241 mol Si) and toluene (Fisher Scientific, 70.0 g) to form a mixture. The flask is equipped with a thermometer, Teflon stir paddle, and a Dean Stark apparatus pre-filled with toluene and attached to a water-cooled condenser. A nitrogen blanket is then applied. An oil bath is used for heating.

The mixture is heated at reflux for 30 min and subsequently cooled to 100° C. At this point, a solution of oxime capped PDMS, formed using the method described above, is added. More specifically, the oxime capped PDMS is formed using 70.0 g toluene, 27.0 g silanol terminated PDMS, Gelest DMS-S27 184 dp and 1.25 g MTO from Gelest. The oxime-PDMS is added quickly to the phenylsilsesquioxane hydrolyzate at 100° C., heated at reflux for 5 hrs after which n-butanol (6 g, Fisher Scientific) is added and further heated at reflux for another 3 hrs. At this point, some volatiles are then removed by distillation to increase a solids content to about 40 wt %. Subsequently, the mixture is cooled to room temperature. The organosiloxane block copolymer formed herein is bluish in color. Cast sheets are then formed by pouring the organosiloxane block copolymer onto a flat surface and evaporating the solvent overnight at room temperature. The cast sheets appear hazy/cloudy. After formation, the organosiloxane block copolymer of this example is analyzed by $^{29}Si$ NMR which confirms a structure of $(Me_2SiO_{2/2})_{0.583}(MeSiO_{3/2})_{0.007}(PhSiO_{3/2})_{0.410}$ with 16.3 mol % $OR^3$, wherein $R^3$ is as described above.

Comparative Example 3

64 mol % (75 wt %) Phenyl-T Units

In a further comparative example, an organosiloxane block copolymer is formed using oxime terminated PDMS and has approximately 64 mol % of Phenyl-T units which corresponds to about 75 wt % of Phenyl-T units. More specifically, a 500 mL 3-neck round bottom flask is loaded with a phenylsilsesquioxane hydrolyzate (Dow Corning 217 Flake, 45.0 g, 0.328 mol Si) and toluene (Fisher Scientific, 100.0 g) to form a mixture. The flask is equipped with a thermometer, Teflon stir paddle, and a Dean Stark apparatus pre-filled with toluene and attached to a water-cooled condenser. A nitrogen blanket is then applied. An oil bath is used for heating.

The mixture is heated at reflux for 30 min and subsequently cooled to 100° C. At this point, a solution of oxime capped PDMS, formed using the method described above, is added. More specifically, the oxime capped PDMS is formed using 40.0 g toluene, 15.0 g silanol terminated PDMS, Gelest DMS-S27 184 dp and 0.697 g MTO from Gelest. The oxime-PDMS is added quickly to the phenylsilsesquioxane hydrolyzate at 100° C., heated at reflux for 5.25 hrs. At this point, some volatiles are then removed by distillation to increase a solids content to about 40 wt %. Subsequently, the mixture is cooled to room temperature. The organosiloxane block copolymer formed herein is hazy/cloudy. Cast sheets are then formed by pouring the organosiloxane block copolymer onto a flat surface and evaporating the solvent overnight at room temperature. The cast sheets are brittle and appear lightly hazy/cloudy. After formation, the organosiloxane block copolymer of this example is analyzed by $^{29}Si$ NMR which confirms a structure of $(Me_2SiO_{2/2})_{0.353}(PhMeSiO_{2/2})_{0.003}$ $(MeSiO_{3/2})_{0.004}(PhSiO_{3/2})_{0.640}$ with 25.8 mol % $OR^3$, wherein $R^3$ is as described above.

Comparative Example 4

No Additional Alkyltriacetoxysilane Cross-Linker Added After Copolymer Formation In yet another comparative example, a 500 mL 3-neck round bottom flask is loaded with a phenylsilsesquioxane hydrolyzate (Dow Corning 217 Flake, 16.8 g, 0.123 mol Si) and toluene (Fisher Scientific, 60.0 g) to form a mixture. The flask is equipped with a thermometer, Teflon stir paddle, and a Dean Stark apparatus pre-filled with toluene and attached to a water-cooled condenser. A nitrogen blanket is then applied. An oil bath is used for heating.

The mixture is heated at reflux for 1 hr and subsequently cooled to 108° C. At this point, a solution of acetoxy capped PDMS, formed using the method described above, is added. More specifically, the acetoxy capped PDMS is formed using 80.0 g toluene, 43.20 g silanol terminated PDMS (Dow Corning SFD750, 184 dp) and 1.54 g alkyltriacetoxysilane (ETS-900 from Dow Corning). The acetoxy-terminated PDMS is added quickly to the phenylsilsesquioxane hydrolyzate at 100° C. and heated at reflux for a total of 11 hours. Notably, this comparative example does not include addition of the ETS-900 followed by subsequent reflux. After formation cast sheets are then formed by pouring the organosiloxane block copolymer onto a flat surface and evaporating the solvent overnight at room temperature. The cast sheets appear opaque. The organosiloxane block copolymer of this example has a structure of approximately $(Me_2SiO_{2/2})_{0.82}$ $(PhSiO_{3/2})_{0.17}$ (28 wt % Phenyl-T).

Comparative Example 5

KOH Bodying Technique

In still another comparative example, a 500 ml 3-neck round bottom flask is loaded with phenylsilsesquioxane hydrolyzate (Dow Corning 217 Flake, 16.8 g, 0.123 mol Si), 184 dp silanol terminated PDMS (45.0 g, 0.606 moles Si), and toluene (189.6 g). The flask is equipped with a thermometer, Teflon stir paddle, and a Dean Stark apparatus pre-filled with toluene and attached to a water-cooled condenser. An aqueous solution of 45.7 wt % potassium hydroxide (0.553 g) is then added at room temperature with stirring to form a reaction mixture. The reaction mixture is heated at reflux for a total of 7.5 hours and neutralized with dry-ice and filtered through a 1.2 μm filter. The solvent-less product is a hazy/cloudy viscous liquid and has a composition of $(Me_2SiO_{2/2})_{0.82}(PhSiO_{3/2})_{0.18}$ (29 wt % Phenyl-T, R/L ratio 4/1) using KOH bodying as confirmed by $^{29}Si$ NMR.

Comparative Example 6

Chlorosilane Copolymerization Technique

In another comparative example, a 2 L 3-neck round bottom flask is loaded with 184 dp silanol terminated PDMS (500.0 g, 6.74 moles Si) and toluene (519.0 g, 1.42 mols). The flask is equipped with a thermometer, Teflon stir paddle, and a Dean Stark apparatus pre-filled with toluene and attached to a water-cooled condenser. Phenyltrichlorosilane (300.0 g) is quickly added to the silanol terminated PDMS and toluene. Subsequently, a 12 L 3-neck round bottom flask is loaded with DI water (1766.6 g) and toluene (1211.0 g). This flask is also equipped with a thermometer, Teflon stir paddle, and a water-cooled condenser. The mixture of the phenyltrichlorosilane, silanol terminated PDMS, and toluene is added to the DI water and toluene with vigorous mixing for about 25 minutes and then the entire mixture is transferred into a 6 L separatory funnel. The aqueous phase is then removed and the organic phase is washed 4 times using 1200 mL DI water aliquots. The organic phase is then transferred back into a round bottom flask and heated to reflux. Residual water is removed by azeotropic distillation. Solvent is then removed using a rotary evaporator, an oil bath temperature of 150° C., and a vacuum of about 1 mm Hg. The product is a milky white liquid with a viscosity of about 8400 cP measured at 25° C. and a composition that corresponds to $(Me_2SiO_{2/2})_{0.82}(PhSiO_{3/2})_{0.18}$ (28 wt % Phenyl-T, R/L ratio 4/1).

Comparative Example 7

Ethoxy-Terminated PDMS Technique

In a further comparative example, triethoxy terminated PDMS is formed. More specifically, a 500 ml 3-neck round bottom flask is loaded with silanol terminated 184 dp PDMS (Gelest DMS-527, 175.0 g, 2.36 moles Si), tetraethoxysilane (TEOS) (Gelest, 53.5 g, 0.257 mols), and potassium acetate (Fisher Scientific, 0.229 g). The flask is equipped with a thermometer, Teflon stir paddle, and a Dean Stark apparatus pre-filled with toluene and attached to a water-cooled condenser. A nitrogen blanket is then applied. An oil bath is used for heating. The mixture of the silanol terminated 184 dp PDMS, tetraethoxysilane, and potassium acetate is then heated at 150° C. for 20 hrs. At this point, $^{29}Si$ NMR indicated that ~44% of SiOH groups remain unreacted. Accordingly, additional potassium acetate (0.916 g) is added and the mixture is heated at 150° C. for 33 additional hours. Subsequently, the mixture is pressure filtered through a 1.2 μm filter and stripped to dryness using a rotavapor, an oil bath at a temperature of 100° C., and a vacuum. $^{29}Si$ NMR indicates no presence of SiOH groups and no TEOS.

The triethoxy terminated PDMS formed in the immediately preceding step is then reacted with phenylsilsesquioxane hydrolyzate. More specifically, a 500 ml 3-neck round bottom flask is loaded with a phenylsilsesquioxane hydrolyzate (Dow Corning 217 Flake, 16.8 g, 0.123 moles Si) and toluene (Fisher Scientific, 60.0 g). The flask is equipped with a thermometer, Teflon stir paddle, and a Dean Stark apparatus pre-filled with toluene and attached to a water-cooled condenser. A nitrogen blanket is then applied. An oil bath is used for heating. The mixture is heated at reflux for 30 min. Subsequently, the mixture is cooled to 100° C. and a solution of triethoxy terminated PDMS (43.2 g) and toluene (80.0 g) is added. The mixture turns opaque and additional toluene (44.1 g) is added to make the mixture turn clear. 1.22 g of tetra-n-butoxy titanate (DuPont Tyzor TnBT) is then added and the mixture returns to an opaque color. Additional toluene (52.8 g) is added and the mixture is refluxed for a total of 15 hours. After formation, cast sheets are then formed by pouring the mixture onto a flat surface and evaporating the solvent overnight at room temperature. The cast sheets appear opaque.

Comparative Example 8

Formation of Organosiloxane Block Copolymer Using Oxime Terminated PDMS

In an eighth comparative example, an organosiloxane block copolymer is formed using oxime terminated PDMS and has approximately 30 mol % of Phenyl-T units which corresponds to about 44 wt % of Phenyl-T units. More specifically, a 500 mL 3-neck round bottom flask is loaded with a phenylsilsesquioxane hydrolyzate (Dow Corning 217 Flake, 26.4, 0.193 mol Si) and toluene (Fisher Scientific, 80.0 g) to form a mixture. The flask is equipped with a thermometer, Teflon stir paddle, and a Dean Stark apparatus pre-filled with toluene and attached to a water-cooled condenser. A nitrogen blanket is then applied. An oil bath is used for heating.

The mixture is heated at reflux for 30 min and subsequently cooled to 100° C. At this point, a solution of oxime capped PDMS, formed using the method described above, is added. More specifically, the oxime capped PDMS is formed using 60.0 g toluene, 33.6 g silanol terminated PDMS, Gelest DMS-S27 184 dp and 1.56 g MTO from Gelest. The oxime-PDMS is added quickly to the phenylsilsesquioxane hydrolyzate at 100° C., heated at reflux for 3 hrs after which n-butanol (6 g, Fisher Scientific) is added and further heated at reflux for another 3 hrs. At this point, some volatiles are then removed by distillation to increase a solids content to about 40 wt %. Subsequently, the mixture is cooled to room temperature. The organosiloxane block copolymer formed herein is optically clear and colorless. Cast sheets are then formed by pouring the organosiloxane block copolymer onto a flat surface and evaporating the solvent overnight at room temperature. The cast sheets appear somewhat hazy/cloudy. After formation, the organosiloxane block copolymer of this example is analyzed by $^{29}$Si NMR which confirms a structure of $(Me_2SiO_{2/2})_{0.695}(MeSiO_{3/2})_{0.008}(PhSiO_{3/2})_{0.297}$ with 10.5 mol % $OR^3$, wherein $R^3$ is as described above.

Comparative Example 9

Formation of Organosiloxane Block Copolymer Using Oxime Terminated PDMS

In a ninth comparative example, an organosiloxane block copolymer is formed using oxime terminated PDMS and has approximately 10 mol % of Phenyl-T units which corresponds to about 15 wt % of Phenyl-T units. More specifically, a 500 mL 3-neck round bottom flask is loaded with a phenylsilsesquioxane hydrolyzate (Dow Corning 217 Flake, 9.00, 0.0657 mol Si) and toluene (Fisher Scientific, 60.0 g) to form a mixture. The flask is equipped with a thermometer, Teflon stir paddle, and a Dean Stark apparatus pre-filled with toluene and attached to a water-cooled condenser. A nitrogen blanket is then applied. An oil bath is used for heating.

The mixture is heated at reflux for 30 min and subsequently cooled to 100° C. At this point, a solution of oxime capped PDMS, formed using the method described above, is added. More specifically, the oxime capped PDMS is formed using 80.0 g toluene, 51.0 g silanol terminated PDMS (Dow Corning 3-0213, 400 dp) and 1.09 g MTO from Gelest. The oxime-PDMS is added quickly to the phenylsilsesquioxane hydrolyzate at 100° C., heated at reflux for 6 hrs after which n-butanol (6 g, Fisher Scientific) is added and further heated at reflux for another 1 hour. At this point, some volatiles are then removed by distillation to increase a solids content to about 40 wt %. Subsequently, the mixture is cooled to room temperature. The organosiloxane block copolymer formed herein is clear. Cast sheets are then formed by pouring the organosiloxane block copolymer onto a flat surface and evaporating the solvent overnight at room temperature. The cast sheets appear opaque. After formation, the organosiloxane block copolymer of this example is analyzed by $^{29}$Si NMR which confirms a structure of $(Me_2SiO_{2/2})_{0.899}(MeSiO_{3/2})_{0.005}(PhSiO_{3/2})_{0.096}$ with 1.78 mol % $OR^3$, wherein $R^3$ is as described above.

Comparative Example 10

Formation of Organosiloxane Block Copolymer Using Oxime Terminated PDMS

In a tenth comparative example, an organosiloxane block copolymer is formed using oxime terminated PDMS and has approximately 18 mol % of Phenyl-T units which corresponds to about 28 wt % of Phenyl-T units. More specifically, a 500 mL 3-neck round bottom flask is loaded with a phenylsilsesquioxane hydrolyzate (Dow Corning 217 Flake, 16.93 g, 0.124 mol Si) and toluene (Fisher Scientific, 80.0 g) to form a mixture. The flask is equipped with a thermometer, Teflon stir paddle, and a Dean Stark apparatus pre-filled with toluene and attached to a water-cooled condenser. A nitrogen blanket is then applied. An oil bath is used for heating.

The mixture is heated at reflux for 30 min and subsequently cooled to 100° C. At this point, a solution of oxime capped PDMS, formed using the method described above, is added. More specifically, the oxime capped PDMS is formed using 60.0 g toluene, 43.07 g silanol terminated PDMS (Dow Corning 3-0213, 400 dp) and 0.918 g MTO from Gelest. The oxime-PDMS is added quickly to the phenylsilsesquioxane hydrolyzate at 100° C., heated at reflux for 6 hrs after which n-butanol (6 g, Fisher Scientific) is added and further heated at reflux for another 3 hrs. At this point, some volatiles are then removed by distillation to increase a solids content to about 40 wt %. Subsequently, the mixture is cooled to room temperature. The organosiloxane block copolymer formed herein is hazy/cloudy. Cast sheets are then formed by pouring the organosiloxane block copolymer onto a flat surface and evaporating the solvent overnight at room temperature. The cast sheets appear opaque. After formation, the organosiloxane block copolymer of this example is analyzed by $^{29}$Si NMR which confirms a structure of $(Me_2SiO_{2/2})_{0.814}(MeSiO_{3/2})_{0.004}(PhSiO_{3/2})_{0.182}$ with 5.49 mol % $OR^3$, wherein $R^3$ is as described above.

Evaluation of Optical Clarity of Cast Sheets:

The Cast Sheets of Examples 1-3 and Comparative Examples 1-3 and 8 are evaluated to determine optical clarity. More specifically, % Transmission of light at wavelengths from about 350-1000 nanometers is measured through 1 mm thick samples. The values for % transmission are set forth below. Pictorial representations of the cast sheets of Comparative Example 1, Examples 1-3, Comparative Example 8, Comparative Example 2, and Comparative Example 3, left to right, respectively, are set forth in FIG. 5. In addition, FIG. 6 is a spectrum of % transmission versus wavelength of the cast sheets of Comparative Examples 1, 2, and 8 and Examples 1-3.

Figure 5:
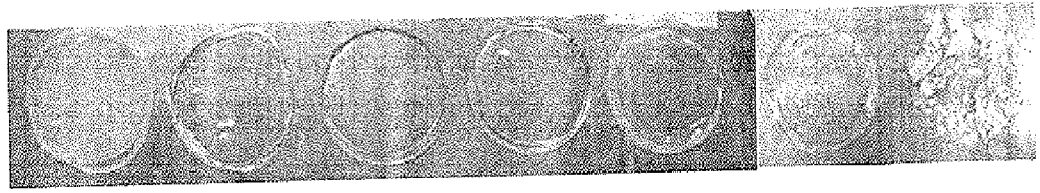
FIG. 5 is a photograph illustrating the clarity of cast sheets formed from Comparative Example 1, Examples 1-3, Comparative Example 8, Comparative Example 2, and Comparative Example 3, left to right, respectively.
Figure 6:
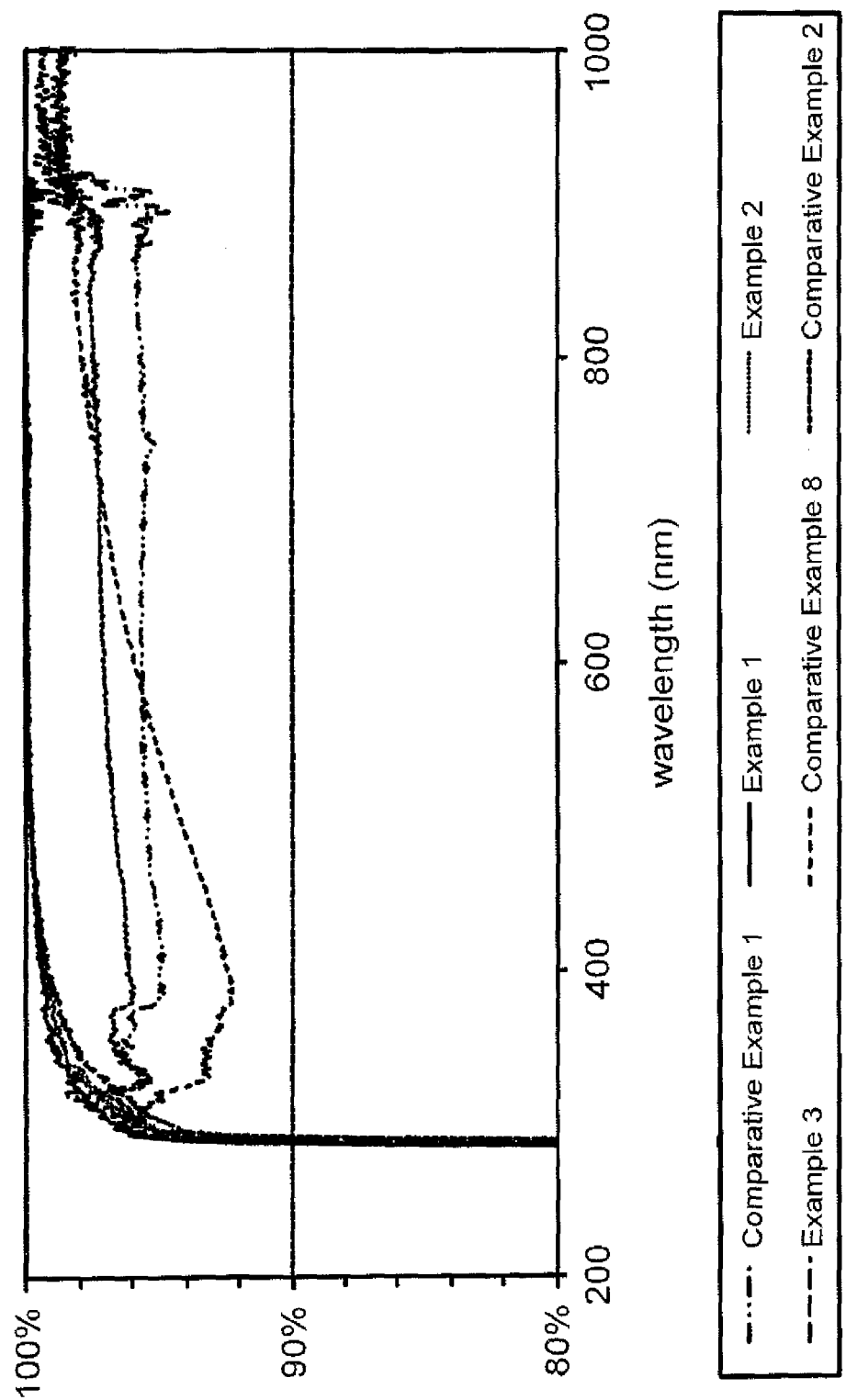
FIG. 6 is a spectrum of % transmission versus wavelength of cast sheets formed from Comparative Examples 1, 2, and 8 and Examples 1-3.

The data set forth in FIGS. 5 and 6 indicates that the particular weight percent of linear diorganosiloxane units and the particular weight percentage of non-linear siloxane units of this invention produce cast sheets that have unexpectedly high percent transmissions of light over a wide spectrum. The data set forth in these Figures also indicates that certain weight percentages of linear diorganosiloxane units and the particular weight percentage of non-linear siloxane units, as represented in the comparative examples, do not produce such results.

Evaluation of Physical Properties of Cast Sheets:

The Cast Sheets of Examples 1-3 and 6 and Comparative Examples 1, 2, 4, 8, 9, and 10 are also evaluated to determine the physical properties of Tensile Strength, Elongation, Shore A, Tear Strength Die C, and Refractive Index pursuant to ASTM Methods D412, D412, D2240, D624, and D542, respectively. The Cast Sheets of these examples are each cured for about 3 hours at a temperature of about 160° C. The results of these evaluations are set forth in the Table below:

|  | Example 1 | Example 2 | Example 3 | Example 6 |
|---|---|---|---|---|
| Phenyl-T (Weight %) | 20 | 28 | 34 | 28 |
| Phenyl-T (Mol %) | 11 | 17 | 21 | 17 |
| Appearance T, Sl Cl, Cl | T | T | T | T |
| Approximate Linear Segment Dp | 184 | 184 | 184 | 184 |
| Approximate Tensile Strength (MPa) | 1.55 | 2.29 | 4.5 | 5.0 |
| Approximate Elongation At Break (%) | 154 | 585 | 334 | 425 |
| Approximate Tear Strength (Die C, Kn/M) | 4.0 | 7.3 | 3.3 | n/a |
| Approximate Shore A Hardness | 26 | 34 | 40 | 38 |
| Approximate Refractive Index | 1.430 | 1.441 | 1.449 | 1.44 |

|  | Comp. Example 1 | Comp. Example 2 | Comp. Example 4 | Comp. Example 8 | Comp. Example 9 | Comp. Example 10 |
|---|---|---|---|---|---|---|
| Phenyl-T (Weight %) | 10 | 55 | 28 | 44 | 15 | 28 |
| Phenyl-T (Mol %) | 6 | 41 | 17 | 30 | 10 | 18 |
| Appearance T, Sl Cl, Cl | Cl | Sl Cl | Cl | Sl Cl | Cl | Cl |
| Approximate Linear Segment Dp | 184 | 184 | 184 | 184 | 400 | 400 |
| Approximate Tensile Strength (MPa) | 0.75 | 6.6 | 3.7 | 6.5 | 0.7 | 1.2 |
| Approximate Elongation At Break (%) | 116 | 200 | 561 | 163 | 129 | 350 |
| Approximate Tear Strength (Die C, Kn/M) | 2.4 | 12 | 4.3 | 10.6 | 3 | 6 |
| Approximate Shore A Hardness | 22 | 86 | 36 | 59 | 22 | n/a |
| Approximate Refractive Index | 1.418 | n/a | n/a | 1.464 | n/a | n/a |

In the above Table, "T" represents a visual evaluation that the sample is translucent. "Sl Cl" represents a visual evaluation that the sample is somewhat cloudy. "Cl" represents a visual evaluation that the sample is cloudy.

Notably, Comparative Example 3 is not tested since the sample is too brittle. Comparative Example 5 is not tested since the sample is a cloudy liquid. Comparative Example 6 is not tested since the sample is a milky white liquid. Comparative example 7 is not tested since sheets are cloudy and weak.

The results show that optically clear copolymer sheets are formed for phenyl-T mol % levels 11, 17 and 21 for linear PDMS lengths of 184 dp. In general, compositions that form optically clear sheets result in higher sheet toughness as reflected by a higher tensile strength and elongation at break. The combination of high optical clarity and high elongation of these sheets is desirable in many applications such as electronic laminates.

Evaluation of the Viscoelastic Profile of a Representative Example

Figure 7:
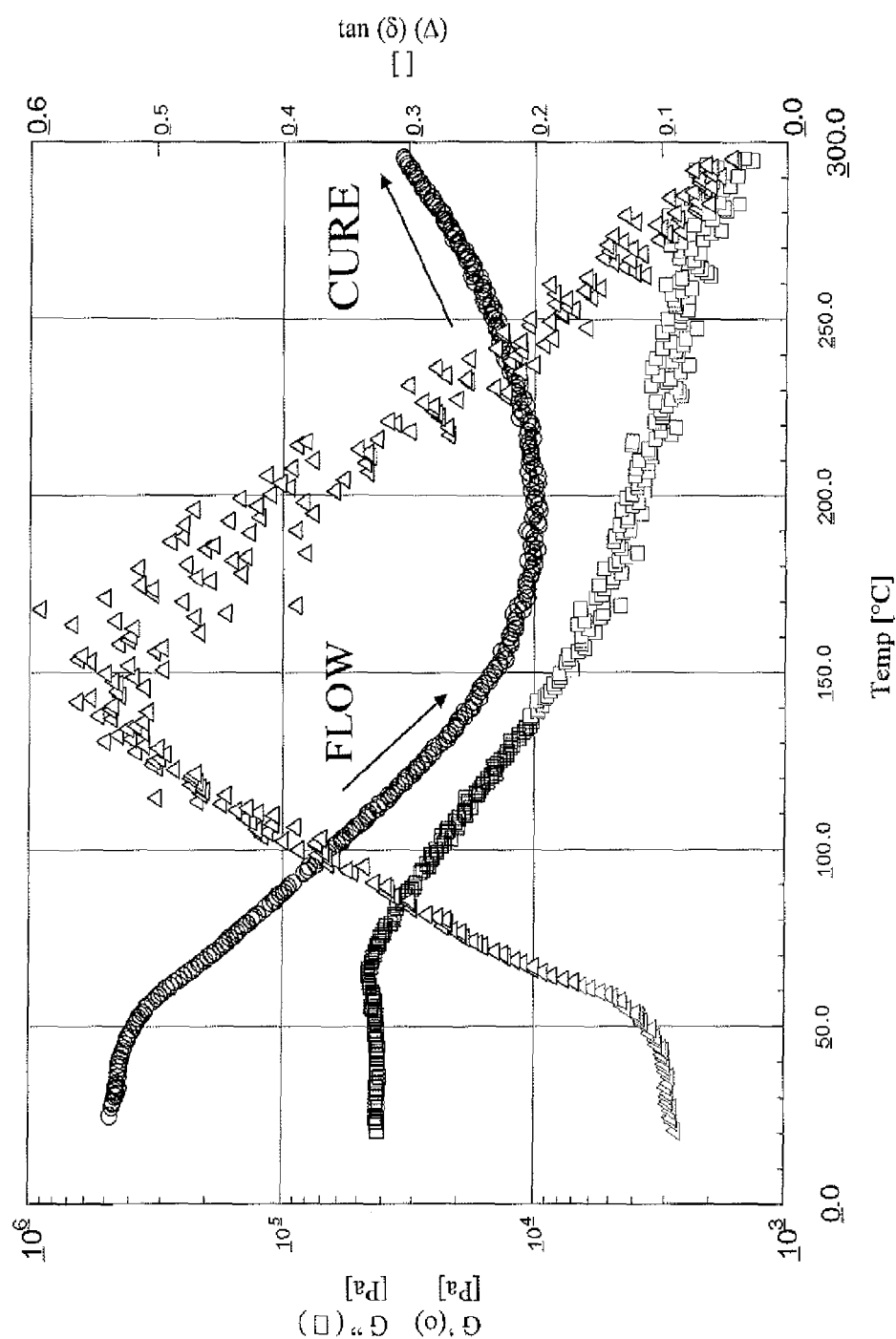
FIG. 7 is a viscoelastic profile of the cast sheet of Example 2.

The cast sheet of Example 2 is evaluated to determine a viscoelastic profile, which is visually depicted in FIG. 7. In this Figure, melt processability can be seen from a drop in the storage modulus (G') around 50° C., whereas the upturn in G' around 200° C. indicates condensation cure of silanol groups on the Phenyl-T resin. Said differently, this Figure shows that G' drops as temperature increases which indicates that viscosity decreases as temperature increases. This drop mimics what occurs in industrial lamination processes and is typically desirable. At some point, viscosity then rises as temperature continues to increase which generally indicates that curing is occurring. This is also typically desirable and mimics industrial processes.

Single Photovoltaic Cell Lamination Evaluations:

The compositions of Comparative Example 1 and Examples 1-3 are also used to encapsulate single photovoltaic cells via a typical lamination process, as is well known in the art. More specifically, copolymers of Comparative Example 1 and Examples 1-3 are cast from 30% toluene and room temperature evaporated overnight. Max tan delta (δ) and the temperature (° C.) at max tan delta (δ) are determined before lamination to link the ability to effectively laminate the copolymer sheet with its rheological profile. This analysis is performed using an ARES rheometer in the small strain oscillatory mode. Max tan delta (δ) generally indicates the ability of a polymeric material to flow. The higher the max in tan delta, the greater the ability of the polymeric material to flow. The temperature at the max tan delta (δ) is evaluated to determine the optimum lamination temperature of the encapsulant. The next step is to cast films for actual lamination into one-cell modules.

Casting Films for Encapsulation:

Comparative Example 1 and Examples 1-3 are used to form films that are cast from solution (about 30-40 wt % solids in toluene) by pouring into an aluminum chase placed over a platen covered with a Teflon release liner. Films of approximately 20 mil thicknesses are cast by visually approximating filling to the top of a 75 mil thick chase. Specifically, films of the same approximate thickness are cast by pouring about 35 g of solution into a 6×6" chase, or 100 g of solution into a 9×9" chase. Solvent is evaporated from the films overnight in a hood with a speed of 100 ft/sec. The films are cut from the chase, measured for thickness, and stored between Teflon sheets in ziplock bags. Films are used within 2 days after casting.

Encapsulation with Organosiloxane Block Copolymers:

Front and back sheet encapsulation is achieved by casting a sheet, approximately 20 mil thick and slightly larger than 6×6", directly on a 6×6" piece of Solatex glass. A soldered BP monocrystalline cell is placed over the various copolymers (face down) and covered with another sheet of the same composition. The assembly is covered with a Teflon release liner, and laminated for 90 minutes after a 2 minute equilibration at 160° C.

After encapsulation, the photovoltaic cells are evaluated to determine lamination quality, as set forth immediately below:

|  | Lamination Quality | Max Tan Delta δ) | Temperature (° C.) at Max Tan Delta (δ) |
| --- | --- | --- | --- |
| Example 1 | Excellent | 1.0 | 140 |
| Example 2 | Excellent | 0.6 | 140 |
| Example 3 | Excellent | 0.7 | 153 |
| Comparative Example 1 | Cloudy Sheet | 0.7 | 106 |

The results evidence excellent lamination quality obtained with Examples 1, 2 and 3. The max in tan delta close to 1.0 indicates good flow of the sheet ensuring the excellent lamination quality. The temperature at the maximum in tan delta confirms that 140-160° C. is an acceptable lamination temperature.

Single Photovoltaic Cell Accelerated Ageing Studies:

The encapsulated single photovoltaic cells of Examples 1 and 2 above are also evaluated to determine efficiency loss over time based on accelerated ageing. More specifically, the encapsulated single photovoltaic cells of Examples 1 and 2 are tested for efficiency (% of power converted vs. collected) based on humidity freeze and thermal cycling testing according to IEC 61215, which is known in the art.

In these tests, the humidity freeze cycles are as follows: 85° C./85% R.H. 21 h hold; Quench to −40° C.; 1 h hold (IEC Standard specifies <5% loss over 50 days). The humidity freeze data is normalized at day one to allow for comparison and change in efficiency is plotted over time and set forth in FIG. 8.

Moreover, the thermal cycles used in these tests are as follows: 1 h cycles at 90° C. to −40° C. with 1 h hold (IEC Standard specifies <5% loss over 40 days). The thermal cycle data is normalized at day one to allow for comparison and the change in efficiency is plotted over time and set forth in FIG. 9.

Figure 8:
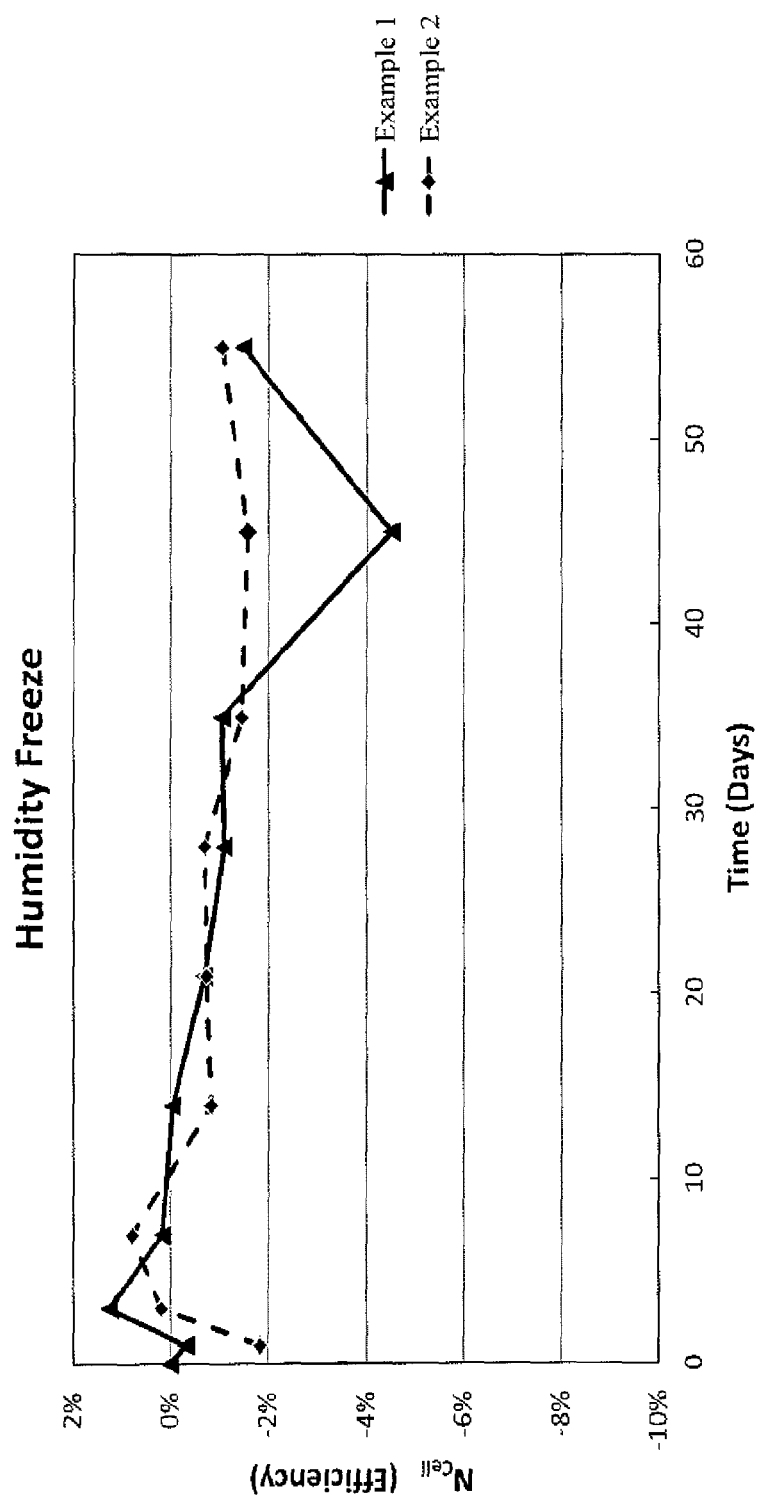
FIG. 8 is a line graph illustrating cell efficiency versus number of days after a humidity freeze of the encapsulated single photovoltaic cells of Examples 1 and 2.
Figure 9:
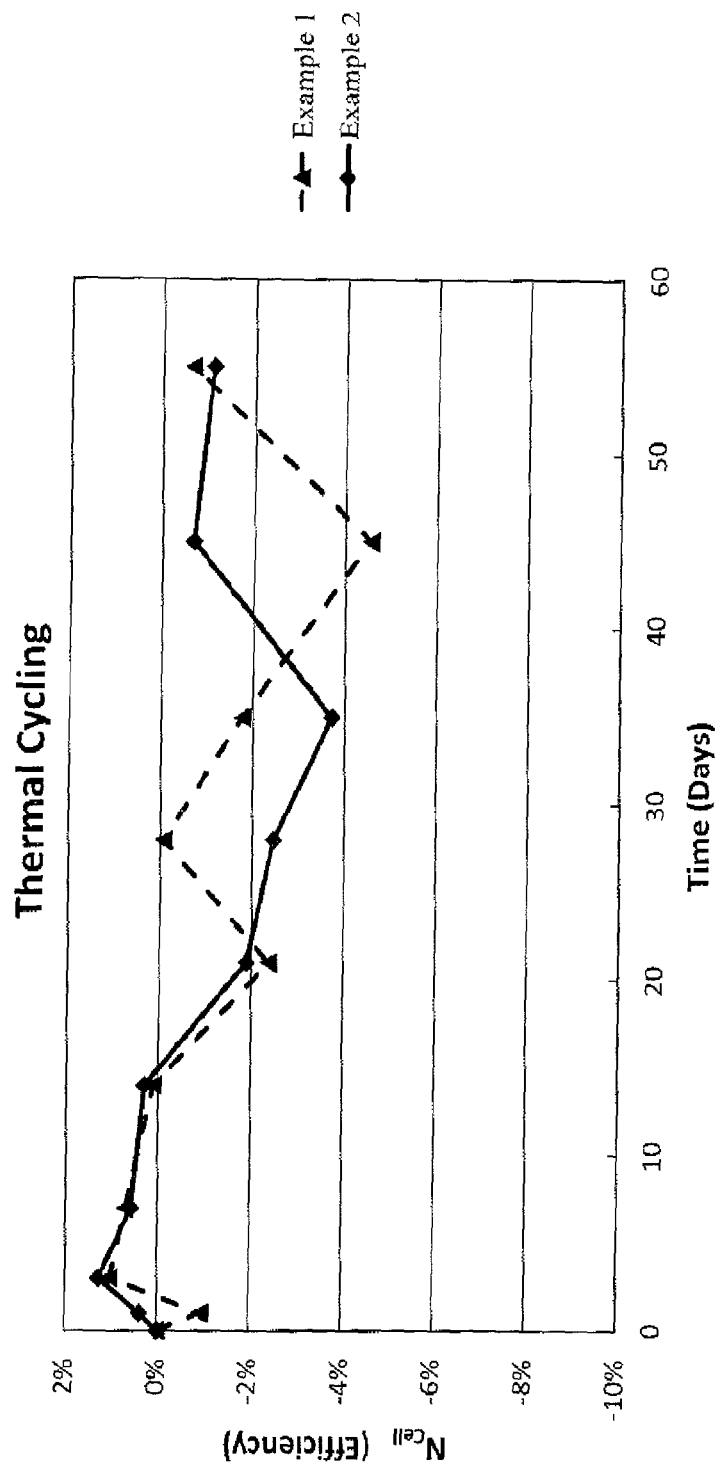
FIG. 9 is a line graph illustrating cell efficiency versus number of days after thermal cycling of the encapsulated single photovoltaic cells of Examples 1 and 2.

The data set forth in FIGS. 8 and 9 generally indicate that the photovoltaic cells of this invention pass the IEC 61215 standard and exhibit less than 5% loss in efficiency over both 50 and 40 days, relative to humidity and thermal testing, respectively.

Overall, the data set forth in the Examples above evidence that the chemistry of this invention produces organopolysiloxane block copolymers having unexpectedly high % transmission. Also, since no organic groups or polymer segments are incorporated, excellent retention of optical transmittance can be expected. Moreover, these copolymers have excellent physical properties and can be used effectively to form electronic articles, such as photovoltaic cell modules, that withstand ageing and pass IEC 61215. These copolymers can also be used in various processes to form the electronic articles such as lamination, as shown in the viscoelastic profile of FIG. 7. In addition, cure tends to follow lamination such that a robust laminate assembly can be formed.

It is to be understood that the appended claims are not limited to express and particular compounds, compositions, or methods described in the detailed description, which may vary between particular embodiments which fall within the scope of the appended claims. With respect to any Markush groups relied upon herein for describing particular features or aspects of various embodiments, it is to be appreciated that different, special, and/or unexpected results may be obtained from each member of the respective Markush group independent from all other Markush members. Each member of a Markush group may be relied upon individually and or in combination and provides adequate support for specific embodiments within the scope of the appended claims.

It is also to be understood that any ranges and subranges relied upon in describing various embodiments of the present invention independently and collectively fall within the scope of the appended claims, and are understood to describe and contemplate all ranges including whole and/or fractional values therein, even if such values are not expressly written herein. One of skill in the art readily recognizes that the enumerated ranges and subranges sufficiently describe and enable various embodiments of the present invention, and such ranges and subranges may be further delineated into relevant halves, thirds, quarters, fifths, and so on. As just one example, a range "of from 0.1 to 0.9" may be further delineated into a lower third, i.e., from 0.1 to 0.3, a middle third, i.e., from 0.4 to 0.6, and an upper third, i.e., from 0.7 to 0.9, which individually and collectively are within the scope of the appended claims, and may be relied upon individually and/or collectively and provide adequate support for specific embodiments within the scope of the appended claims. In addition, with respect to the language which defines or modifies a range, such as "at least," "greater than," "less than," "no more than," and the like, it is to be understood that such language includes subranges and/or an upper or lower limit. As another example, a range of "at least 10" inherently includes a subrange of from at least 10 to 35, a subrange of from at least 10 to 25, a subrange of from 25 to 35, and so on, and each subrange may be relied upon individually and/or collectively and provides adequate support for specific embodiments within the scope of the appended claims. Finally, an individual number within a disclosed range may be relied upon and provides adequate support for specific embodiments within the scope of the appended claims. For example, a range "of from 1 to 9" includes various individual integers, such as 3, as well as individual numbers including a decimal point (or fraction), such as 4.1, which may be relied upon and provide adequate support for specific embodiments within the scope of the appended claims.

The invention has been described in an illustrative manner, and it is to be understood that the terminology which has been used is intended to be in the nature of words of description rather than of limitation. Many modifications and variations of the present invention are possible in light of the above teachings, and the invention may be practiced otherwise than as specifically described.

What is claimed is:

1. An organosiloxane block copolymer comprising:
    A. 65 to 90 mol % of diorganosiloxane units having the formula $R^1_2SiO_{2/2}$ (I), wherein said diorganosiloxane units are arranged in linear blocks having an average of from 60 to 350 diorganosiloxane units per linear block; and
    B. 10 to 35 mol % of siloxane units having the average formula $R^2_x(OR^3)_ySiO_{(4-x-y)/2}$ (II), wherein said siloxane units are arranged in nonlinear blocks having at least 2 siloxane units per nonlinear block, $0.5 \leq x \leq 1.5$, and $0 \leq y \leq 1$;
    wherein each $R^1$ is independently a $C_1$ to $C_{10}$ hydrocarbyl, each $R^2$ is independently an aryl or $C_4$ to $C_{10}$ hydrocarbyl, at least 50 mol % of $R^2$ are aryl, each $R^3$ is independently $R^1$ or H;
    wherein the organosiloxane block copolymer includes a silsesquioxane resin that is incompatible with the liner siloxane chain; and
    wherein a 1 mm thick cast sheet comprising said organosiloxane block copolymer has a light transmittance of at least 95%; and wherein the organosiloxane block copolymer is made by a process comprising reacting an oxime- or an acetoxy-terminated linear organosiloxane with an organosiloxane resin having the average formula $R^2_x(OR^3)_ySiO_{(4-x-y)/2}$ (II).

2. The organosiloxane block copolymer as set forth in claim 1 wherein said diorganosiloxane units having the formula $R^1_2SiO_{2/2}$ (I) are present in an amount of from 79 to 89 mol %.

3. The organosiloxane block copolymer as set forth in claim 2 wherein said siloxane units having the average formula $R^2_x(OR^3)_ySiO_{(4-x-y)/2}$ (II) are present in an amount of from 11 to 21 mol %.

4. The organosiloxane block copolymer as set forth in claim 1 wherein $0.8 \leq x \leq 1.2$ and $0 \leq y \leq 0.2$.

5. The organosiloxane block copolymer as set forth in claim 1 wherein $R^1$ is methyl, each $R^2$ is aryl, and each $R^3$ is H.

6. The organosiloxane block copolymer as set forth in claim 1 consisting essentially of said diorganosiloxane units having the formula $R^1_2SiO_{2/2}$ (I) and siloxane units having the average formula $R^2_x(OR^3)_ySiO_{(4-x-y)/2}$ (II).

7. A cured product of the organosiloxane block copolymer as set forth in claim 1.

8. A method of forming the organosiloxane block copolymer of claim 1 comprising the step of reacting:
    (a) a linear organosiloxane having the formula $R^1(Z=N-O)_2SiO(R^1_2SiO_{2/2})_nSi(O-N=Z)_2R^1$ (III); and
    (b) an organosiloxane resin having the average unit formula $R^2_x(OR^3)_ySiO_{(4-x-y)/2}$ (II); in
    (c) an organic solvent to form the organosiloxane block copolymer wherein Z is $CR^1_2$ or $CR^4$, wherein $R^4$ is hydrocarbylene, and n has an average value of from 60 to 350.

9. The method as set forth in claim 8 wherein the (a) linear organosiloxane is reacted in an amount of from 65 to 90 mol % with the (b) organosiloxane resin in an amount of from 10 to 35 mol %.

10. The method as set forth in claim 8 wherein the (a) linear organosiloxane is reacted in an amount of from 79 to 89 mol % with the (b) in an amount of from 11 to 21 mol %.

11. The method as set forth in claim 8 further comprising the step of removing the organic solvent.

12. The method as set forth in claim 11 wherein the organosiloxane block copolymer is a sheet.

13. The method as set forth in claim 8 further comprising the step of reacting the organosiloxane block copolymer with an alcohol having from 1 to 10 carbon atoms to form an alkoxy-capped organosiloxane block copolymer.

14. An organopolysiloxane block copolymer that is formed according to the method set forth in claim 8.

15. A method of forming the organosiloxane block copolymer of claim 1 comprising the steps of:
    reacting (d) a linear organosiloxane having the formula $R^1[R^1C(=O)O]_2SiO(R^1_2SiO_{2/2})_nSi[O(O=)CR^1]_2R^1$ with (b) an organosiloxane resin having the average unit formula $R^2_x(OR^3)_ySiO_{(4-x-y)/2}$ (II) in (c) an organic solvent to produce a first reaction product; and
    reacting the first reaction product with a silane having the formula $R^5_qSiX_{4-q}$ to form the organosiloxane block copolymer wherein $R^5$ is a $C_1$ to $C_8$ hydrocarbyl or a $C_1$ to $C_8$ halogen-substituted hydrocarbyl, X is a hydrolysable group, and q is 0, 1, or 2, and
    n has an average value of fom 60 to 350.

16. The method as set forth in claim 15 wherein the (d) linear organosiloxane is reacted in an amount of from 65 to 90 mol % with the (b) organosiloxane resin in an amount of from 10 to 35 mol % to produce the first reaction product.

17. The method as set forth in claim 15 wherein the first reaction product is reacted with 0.1 to 10 mol % silane.

18. The method as set forth in claim 15 further comprising the step of removing the (c) organic solvent.

19. The method as set forth in claim 18 wherein the organosiloxane block copolymer is a sheet.

20. The method as set forth in claim 15 further comprising the step of reacting the organosiloxane block copolymer with an alcohol having from 1 to 10 carbon atoms to form an alkoxy-capped organosiloxane block copolymer.

21. An organopolysiloxane block copolymer that is formed according to the method set forth in claim 15.

22. An electronic article comprising:
    A. an optoelectronic semiconductor; and
    B. an encapsulant disposed on said optoelectronic semiconductor, said encapsulant comprising an organosiloxane block copolymer comprising;
        (1) 65 to 89 mol % of diorganosiloxane units having the formula $R^1_2SiO_{2/2}$ (I), wherein said diorganosiloxane units are arranged in linear blocks having an average of from 10 to 400 diorganosiloxane units per linear block, and (2) 10 to 35 mol % of siloxane units having the average formula $R^2{}_x(OR^3)_y SiO_{(4-x-y)/2}$ (II), wherein said siloxane units are arranged in nonlinear blocks having at least 2 siloxane units per nonlinear block, $0.5 \leq x \leq 1.5$, and $0 \leq y \leq 1$, wherein each $R^1$ is independently a $C_1$ to $C_{10}$ hydrocarbyl, each $R^2$ is independently an aryl or $C_4$ to $C_{10}$ hydrocarbyl, at least 50 mol % of $R^2$ are aryl, each $R^3$ is independently $R^1$ or H; and wherein said organosiloxane block copolymer has a light transmittance of at least 95%; and wherein the organosiloxane block copolymer is made by a process comprising reacting an oxime- or an acetoxy-terminated linear organosiloxane with an organosiloxane resin having the average formula $R^2{}_x(OR^3)_y SiO_{(4-x-y)/2}$ (II).

23. The electronic article as set forth in claim 22 wherein said encapsulant is cured.

24. The electronic article as set forth in claim 22 further comprising a substrate.

25. The electronic article as set forth in claim 22 wherein further comprising a substrate comprising the organosiloxane block copolymer set forth in claim 23.

26. The electronic article as set forth in claim 24 wherein said optoelectronic semiconductor is disposed directly on said substrate and said encapsulant is disposed on, and encapsulates, said optoelectronic semiconductor.

27. The electronic article as set forth in claim 22, wherein said electronic article is a photovoltaic cell module.

28. The electronic article as set forth in claim 22, wherein said electronic article is a photovoltaic array that comprises two or more photovoltaic cell modules.

29. The electronic article as set forth in claim 22, wherein said electronic article is a light emitting diode.

30. A method of preparing the electronic article as set forth in claim 22.

* * * * *